United States Patent [19]

Sano et al.

[11] Patent Number: 4,799,175
[45] Date of Patent: Jan. 17, 1989

[54] SYSTEM FOR INSPECTING PATTERN DEFECTS OF PRINTED WIRING BOARDS

[75] Inventors: Tetsuo Sano; Tetsuo Hohki, both of Kyoto; Eiji Kodama, Higashi-Osaka; Takumi Yoshida, Kusatsu; Masafumi Kawatani, Takatsuki; Hisayuki Tsujinaka, Kyoto, all of Japan

[73] Assignee: Dainippon Screen Mfg., Co., Kyoto, Japan

[21] Appl. No.: 733,506

[22] Filed: May 10, 1985

[30] Foreign Application Priority Data

Jun. 12, 1984 [JP] Japan .................................. 59-120992

[51] Int. Cl.[4] .............................................. H04N 7/00
[52] U.S. Cl. .................................. 364/552; 364/571.01; 382/8; 358/106; 356/394
[58] Field of Search .............. 364/507, 300, 550, 552, 364/571, 579, 580, 488–491; 358/106; 356/394, 398, 125; 354/403; 250/562; 29/758, 847; 198/339.1; 382/8, 30, 34

[56] References Cited

U.S. PATENT DOCUMENTS

| | | | |
|---|---|---|---|
| 3,953,130 | 4/1976 | Iizuka | 356/125 |
| 4,028,728 | 6/1977 | Sharp | 250/562 |
| 4,152,723 | 5/1979 | McMahon et al. | 358/106 |
| 4,179,800 | 12/1979 | Takaba et al. | 29/847 |
| 4,185,298 | 1/1980 | Billet et al. | 358/106 |
| 4,357,085 | 11/1982 | Niwa et al. | 354/403 |
| 4,376,584 | 3/1983 | Hart et al. | 356/394 |
| 4,403,294 | 9/1983 | Hamada et al. | 358/106 |
| 4,421,410 | 12/1983 | Karasaki | 356/394 |
| 4,454,585 | 6/1984 | Ele | 364/552 |
| 4,463,673 | 8/1984 | Moore | 33/614 |
| 4,578,810 | 3/1986 | MacFarlane et al. | 356/398 |
| 4,586,148 | 4/1986 | Rehder et al. | 364/550 |
| 4,622,647 | 11/1986 | Sagnard et al. | 364/580 |
| 4,668,982 | 5/1987 | Tinnerino | 382/8 X |

OTHER PUBLICATIONS

"An Automatic Optical Printed Circuit Inspection System", Robert C. Restrick, III, SPIE vol. 116, Solid State Imaging Devices, 1977, pp. 76-81.
"An Automatic Inspection System for Printed Wiring Board Masks", Goto et al, Pattern Recognition, vol. 12, pp. 443-445, 1980.
"Automated Visual Inspection Techniques and Applications: A Bibliography", Roland T. Chin, Pattern Recognition, vol. 15, No. 4, pp. 343-357, 1982.
"The Inspection: An Automatic Optical Printed Circuit Board (PCB) Inspector", William A. Bentley, SPIE, vol. 201, Optical Pattern Recognition, pp. 37-47, 1979.
"Automated Optical Inspection of Multilayer Printed Circuit Boards", William A. Bentley, SPIE vol. 220, Optics in Metrology and Quality Assurance, pp. 102-107, 1980.

*Primary Examiner*—P. S. Lall
*Assistant Examiner*—V. N. Trans
*Attorney, Agent, or Firm*—Brumbaugh, Graves, Donohue & Raymond

[57] ABSTRACT

Printed wiring boards (PWBs) applied to this inspection system are previously formed with marks in prescribed positional relation to wiring patterns. Deviation of PWBs with respect to absolute coordinates of the inspection system is detected by reading the marks. The PWBs are sequentially set one by one on a movable table, to be subjected to image acquisition of the marks and inspected areas. A first PWB is image-acquisited whereby obtained binary image data of the inspected area are stored in a memory unit. Thereafter a second PWB is image-acquisited, and in advance to the image acquisition of its inspected area, relative misregistration of the both PWBs is found by deviation data on respective marks of the first and second PWBs. The binary image data of the first PWB is read from the memory unit on the basis of the binary image data of the second PWB. When the binary image data of the first PWB are read, positional correction, i.e., time base correction is performed on the read data to correspond to pixels of the second PWB under image acquisition on the basis of data on the previously found amount of relative misregistration. The data on corresponding pixels of the both PWBs are compared with each other thereby to inspect difference between the patterns of the PWBs on the basis of the result of the comparison.

17 Claims, 22 Drawing Sheets

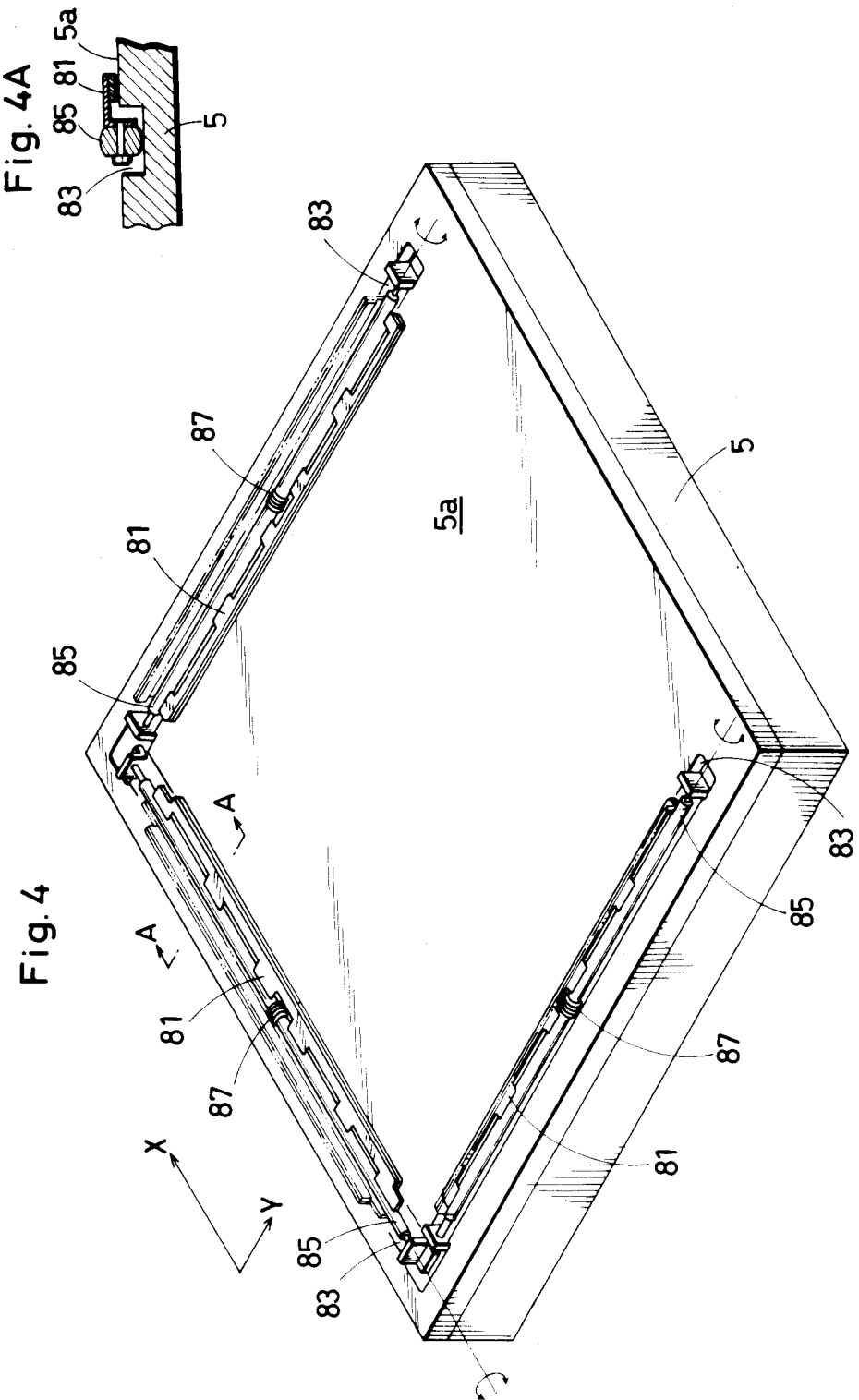

Fig. 13
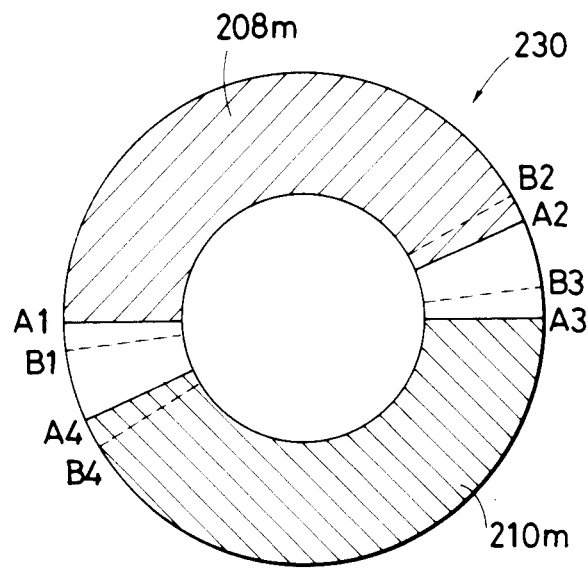
Fig. 27a  Fig. 27b  Fig. 27c  Fig. 27d
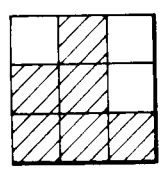 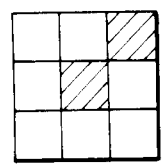 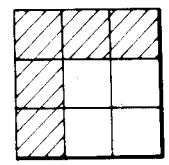 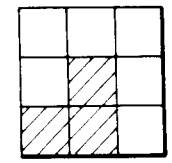

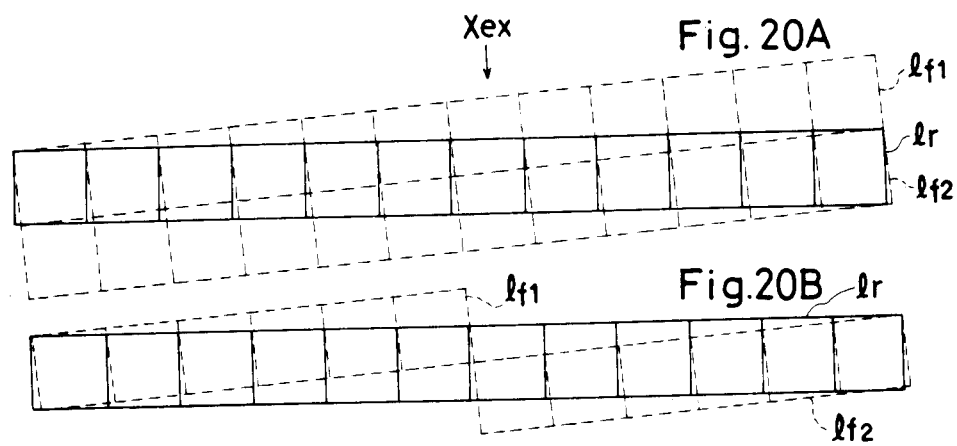
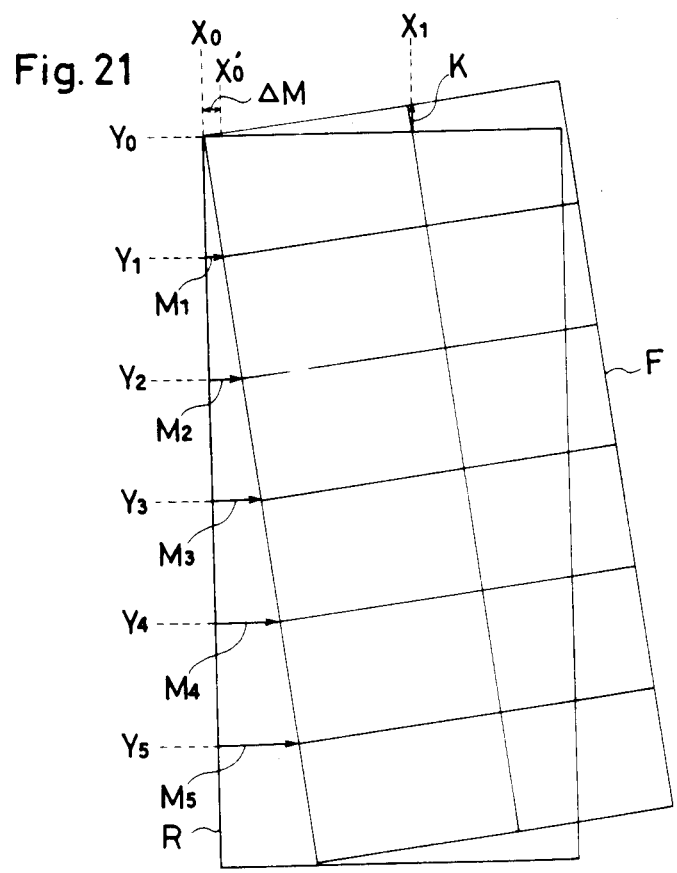

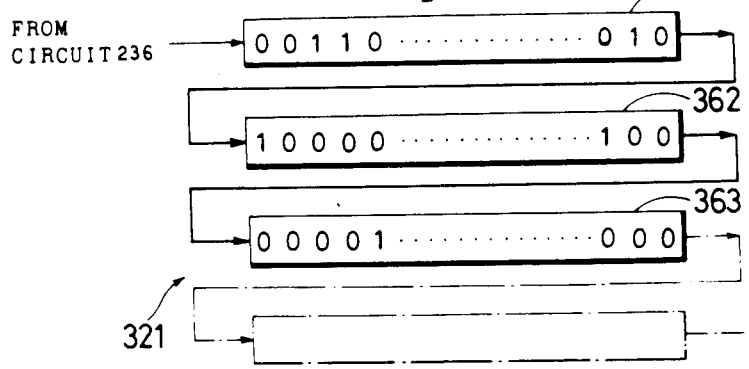
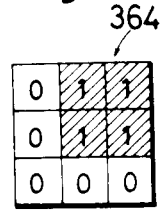
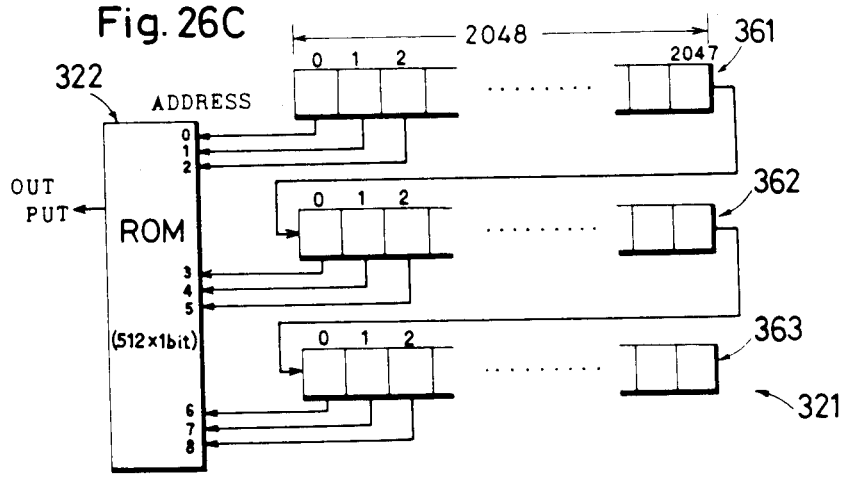

SYSTEM FOR INSPECTING PATTERN DEFECTS OF PRINTED WIRING BOARDS

BACKGROUND OF THE INVENTION

1. Field of the Invention

The present invention relates to a system for inspecting pattern defects of printed wiring boards, and more particularly, it relates to a method of and a device for automatically detecting defects present in wiring patterns by comparing pattern data of the printed wiring boards themselves with each oher.

2. Description of the Prior Art

Pattern defect inspection of printed wiring boards (hereinafter referred to as PWBs) is directed to recognize defects in wiring patterns to correct the same or abandon defective PWBs thereby to efficiently produce PWBs of good quality. Such inspection is generally performed by human inspectors, the operation for which requires much labor and is inferior in workability.

Recently with remarkable development in application of functional elements to ICs and LSIs, PWBs have been rapidly subjected to high density and high accuracy wherefore high reliability is required. Particularly in multilayer PWBs, employment of which is rapidly increased by high densification, pattern defect inspection of inner layers during manufacturing steps is more important than inspection of completed PWBs. Since each PWBs are remarkably highly densified, a great number of steps are required for visually inspecting the same. Thus, there have generally been attempts for optical and electronical automatic inspection, and such attempts are currently put into practice.

Systems of such automatic inspection generally include a system of extracting features of patterns employing information on forms of wiring patterns to be inspected and a comparing system of comparing patterns thereby to find difference therebetween. The former system can detect defects from the patterns themselves, whereas it requires specific defect detecting algorithm based on pattern recognition technique since the information on the forms is employed. The latter system is relatively technically simple in developing and designing stages since it requires no specific algorithm, whereby the cost for development thereof is reduced.

In a pattern defect inspection device of the comparing system, reference patterns are necessarily set so that patterns of PWBs to be inspected are compared with the same thereby to detect the defects by difference in the results of comparison.

The reference patterns are set in two types of methods, one employing original information in design of the PWBs by CAD as the reference patterns and the other employing a previously selected PWB as the reference pattern.

The former method necessarily requires a memory unit for storing the original patterns as the design information, whereby the memory unit requires great volume of storage capacity. Further, the design data are required to be temporarily converted into raster type data for comparison since the same are generally prepared as vector type data. Such conversion requires considerable work, materials such as exclusive hardware and exclusive operators. Further, in order to process the operation by software, elements such as a high-speed computer, disc unit and magnetic tape are required, leading to increased cost with problems rising in processing speed. Further, inner layers of multilayer PWBs, particularly those for industrial use are produced in various types and small amunts, e.g., in 5 to 20 for one type and hence workability is relatively inferior for the labor. In addition, much labor is required for control and application of the reference patterns.

The latter method of selecting the reference PWB processes a non-defective or defect-corrected flawless wiring pattern as an absolute reference, wherefore only one PWB is previously selected by visual inspection. However, since the PWBs, particularly inner layers thereof are produced only in units of 5 to 20 as hereinabove described, it is considerably disadvantageous in workability to select a relatively flawless one from the PWBs by visual inspection, in view of the ratio of the visual inspection time to the number of the entire PWBs.

Pattern defect inspection in the layer system generally adopts structure provided with two pattern reading units in parallel, so as to read the reference PWB pattern by one reading unit and read the pattern of a PWB to be inspected by the other reading unit, thereby to compare the pattern data with each other for deciding defects by difference therebetween. However, the system structure is enlarged in this case since the two pattern reading units are provided in a parallel manner. Further, the most difficult point of this method resides in that the reference pattern and the pattern to be inspected must be correctly aligned with each other. In order to mechanically align the PWBs, employed are conventional mechanical aligning means such as positioning pins and margins. However, such mechanical aligning means cannot avoid misalignment of about 0.1 to 0.5 mm. It is impossible to effect detection on defects of 10 to 50 mm by comparing 10 mm order pixels in pixel correspondence only by mechanical alignment of the PWBs. Therefore, such an attempt has generally been adopted to partially display patterns of two PWBs on a monitor screen so that a skilful operator reads misregistration in the patterns thereby to finely move one of the pattern reading units in order to align corresponding pixels of the PWBs. However, inspection efficiency is limited in such an attempt since such alignment must be effected for inspection of every PWB. Further, the PWBs are manually placed on an inspection table in a general inspection device of this type, and improvements are desired in this point in view of workability.

Apart from the aforementioned methods, it has once been considered to process a photomask for producing a PWB as reference. However, a PWB is generally obtained through a chemical process of etching, and the line width of the wiring pattern varies with the etching process or the extent of the etching. When the photomask is employed as the reference pattern, the amount of change in the line width must always be subjected to feedback to reference pattern data, operation for which is remarkably complicated and hence such an attempt has not been practically adopted.

It must be taken in due consideration in pattern inspection that a PWB is generally obtained through the chemical process of etching.

SUMMARY OF THE INVENTION

An essential object of the present invention is to provide a novel method of and device for inspecting pattern defects of PWBs which requires no setting of a reference pattern in a comparing system, i.e., which is superior in workability to completion of PWB pattern inspection with reduced inspection cost.

Another object of the present invention is to solve general problems in a comparing system, i.e., to effect mutual alignment of wiring patterns by simple means.

Still another object of the present invention is to complete automation of pattern defect inspection by providing a PWB carriage system for automatically placing PWBs on and removing the same from an inspection table for receiving the PWBs.

A further object of the present invention is to save storage capacity of a memory unit for storing pattern data.

A still further object of the present invention is, in view of special characteristics of pattern defect inspection of PWBs obtained through a chemical process of etching, to eliminate influence exerted by the said etching process.

In order to attain the aforementioned objects, the basic point of the present invention first resides in that the only difference in wiring patterns of PWBs may be automatically discriminated in pattern inspection since the PWBs inspected in a pattern inspection device are necessarily processed by hand for correction processing and the like. When marking is applied to different positions, i.e., positions regarded as defective by, e.g., a marker, the marked positions may be simply "watched" in place of "finding" the defects, to perform correction processing etc. simultaneously with decision on the defects. Steps are thus remarkably decreased in comparison with the case of visually inspecting the whole high-density patterns and thereafter performing correction processing etc. What is present in the background of this is that, for example, with respect to inner layers, completely identical defects are caused in two or more PWBs in an astronimical probability so long as the defects are not original defects on photomasks. Such defects on the photomasks are inspected by a plurality of human inspectors further more accurately than pattern inspection of the PWBs.

In the second place, alignment of the wiring patterns is effected by marks in absolute positional relation with the wiring patterns, which marks are previously formed simultaneously with designing of the wiring patterns by CAD. Relative positional relation between two wiring patterns can be recognized by detecting deviation of these marks from absolute coordinates of the pattern inspection system. Therefore, the pattern data can be accurately compared in pixel correspondence on the basis of the said positional relation.

Third, in consideration of etching processing, objects of inspection according to the present invention are the PWBs after etching processing themselves, whereby problems such as change in line width of patterns caused by etching can be previously removed with respect to processing of CAD data and photomask pattern data as reference data. Further, in order to effectively avoid the problem of change in the line width caused by etching, the patterns are sequentially compared along the sequence of etching processing. In other words, when print substrates pass through etching steps in the case where a considerable amount of PWBs are manufactured, no significant difference is caused between etched patterns in etching processing of a print substrate and that of a subsequent print substrate. However, the effect of etching is gradually changed by decrease of an etching solution etc. with a lapse of considerable time, whereby thinning and thickening are caused in the line width of the patterns. Constant provision of a reference pattern is rather undesirable in order to cope with this. The influence by the etching process can be completely avoided in inspection by comparing PWBs of the same lot with each other, preferably along the sequence of etching processing.

Fourth, supplying and discharging PWBs to and from an inspection table can be automatically performed by provision of a PWB carriage system. A plurality of PWBs to be inspected are simply set in prescribed positions and basically a starting button is simply pushed to effect continuous inspection, thereby to attain remarkably high working efficiency.

Briefly stated, the present invention is adapted to process printed wiring board having marks in prescribed positional relation to wiring patterns as objects to be inspected, to find relative misregistration between the printed wiring boards by reading the marks and correct data arrangement of stored pattern data to cancel the said misregistration on the basis of pattern data of the printed wiring boards to be image-acquisited, thereby to compare the pattern data in pixel correspondence.

The above and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic perspective view showing a table for receiving PWBs thereon and FIG. 4A is a cross-sectional view taken along the line A—A in FIG. 4;

FIG. 13 is a typical explanatory diagram illustrative of a memory space for memories shown in FIG. 12;

FIGS. 20A and 20B are typical explanatory views of scanning lines for illustrating pixel changing points;

FIG. 21 is a diagram for illustrating offset of former image data F with respect to subsequent image data R;

FIGS. 26A to 26D are illustrations explanatory of a method for finding defects from error data; and FIGS. 27a to 27d are illustrations respectively showing examples of error patterns.

DESCRIPTION OF THE PREFERRED EMBODIMENTS

Description is now made on a system for inspecting inner layers of multilayer PWBs.

Figure 1:
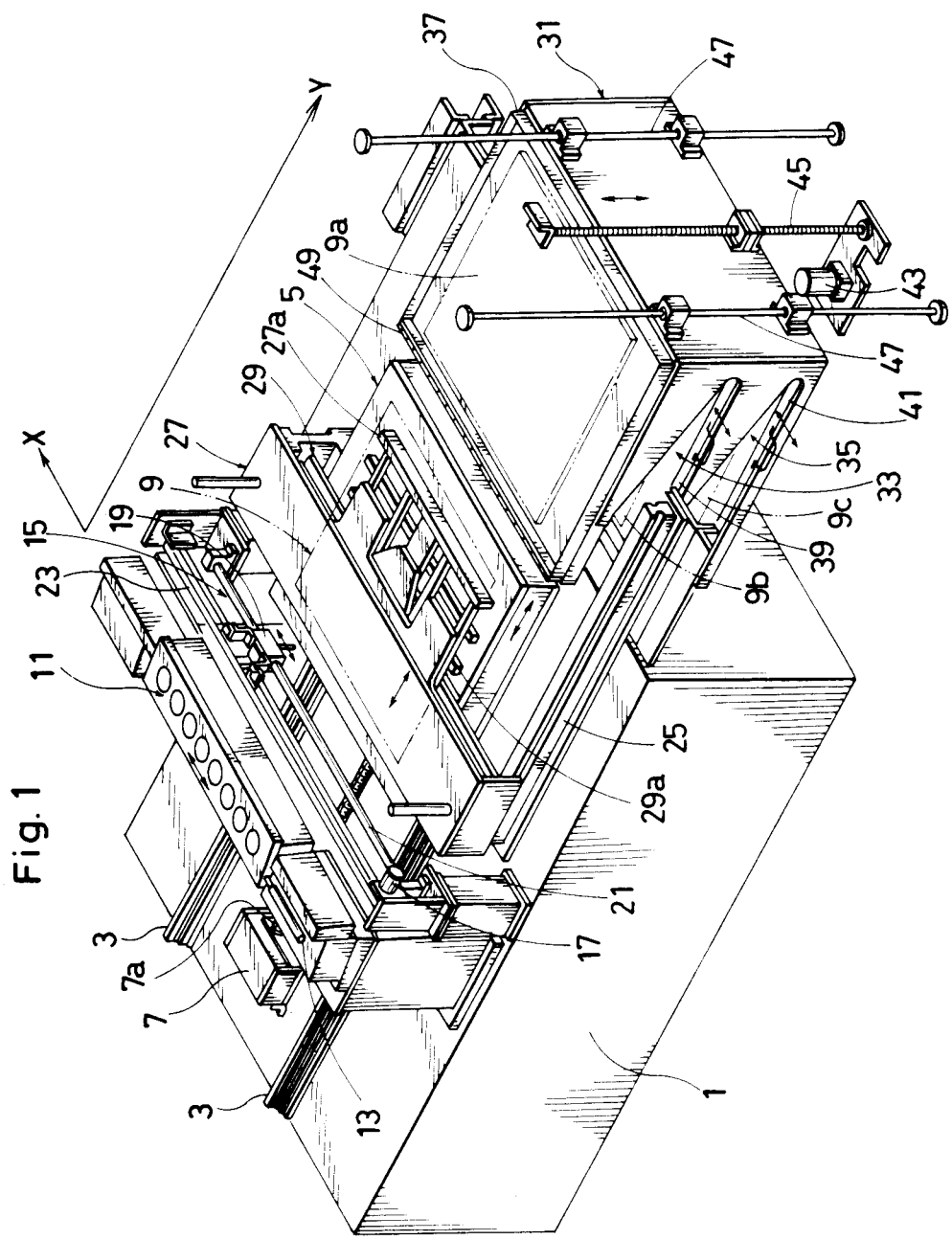
FIG. 1 is a schematic perspective view showing a mechanical system of an embodiment of the present invention.

FIG. 1 is a schematic perspective view of a mechanical system, which shows a frame 1 defining a two-dimensional rectangular coordinate system X—Y. A pair of guide rails 3 are fixed on the frame 1 along the Y-axis direction. A table 5 for carrying PWBs is reciprocatingly driven along the guide rails 3 by a screw shaft 7a which is rotated by a table driving portion 7.

An image pickup block 11 is provided over the guide rails 3 along the X axis for acquisiting images of PWBs 9 carried on the table 5. The image pickup block 11 is reciprocatingly driven along the X axis by a driving means such as an air cylinder.

A marking unit 15 is provided adjacent to the image pickup block 11 for marking the PWBs 9, e.g., by ink. When the table 5 is driven along the Y axis, a motor 17 of the marking unit 15 is operated to control the position of a marking head 19 which is slidable along a guide rod 21 through a cocked belt 23, thereby to mark the PWBs 9 at positions regarded as defective.

A carriage rail 25 is further fixed on the frame 1 to extend along the Y axis over the edges of the frame 1. This carriage rail 25 is adapted to smoothly guide respective one side of two-system PWB carriage means 27 and 29, which are reciprocatingly driven along the Y axis by driving means therefor respectively. A supplying PWB carriage means 27 has a suction pipe frame 27a in its lower portion for automatically supplying uninspected PWBs 9a on the upper surface of the table 5. On the other hand, a discharging PWB carriage means 29 provided under the supplying PWB carriage means 27 has another suction pipe frame 29a in its lower portion for removing the PWBs 9 from the table 5 and automatically carrying the same along the Y axis, thereby to discharge the same in a prescribed portion.

A PWB holding unit 31 is provided adjacent to an end of the frame 1 in the Y-axis direction for holding the PWBs. The PWB holding unit 31 is formed by opening upper stage portion and a lower stage portion vertically divided into two containers 33 and 35 under the upper stage portion. A PWB cassette unit 37 provided with positioning pins and various sensors is fixed to the opening upper stage portion to hold uninspected PWBs 9a which are aligned and overlapped with each other. The container 33 is provided with a cassette 39 having a handle, which can be freely drawn from and received in the cassette unit 31 in the X-axis direction. Similarly, the other container 35 is provided with a cassette 41 having a handle, which can be freely drawn out and received in the cassette unit 31 in the X-axis direction. The cassettes 39 and 41 are adapted to hold inspected PWBs 9b and 9c respectively.

The entire cassette unit 31 for holding the PWBs is vertically driven on the basis of prescribed control signals. When a reversible motor 43 is supplied with driving signals, a driving shaft 45 coupled to the motor 43 is rotated so that the cassette unit 31 is upwardly or downwardly moved along a pair of guide poles 47. It is to be noted that the mechanism for transmitting the drivng force and that around the guide force are not shown in detail or omitted in FIG. 1. The cassette unit 31 is coupled through pulleys with a suspended weight balanced in gravity with the same, whereby the cassette unit 31 is vertically moved in a balanced manner by small driving force.

The cassette unit 31 is vertically driven in an interlocking manner with operations of the aforementioned PWB carriage means 27 and 29. For example, the cassette unit 31 is upwardly driven when the supplying carriage means 27 is moved to be over the cassette unit 31. On the other hand, when the discharging carriage means 29 is moved toward the cassette unit 31, the cassette unit 31 is upwardly driven so as to receive the discharging carriage means 29 in either container 33 or 35. Such interlocking mechanism will be hereinafter described in further detail.

In the cassette unit 31, an electrostatic eliminator 49 is provided along the side portion of the upper stage cassette 37 for holding the overlapped uninspected PWBs 9a. This electrostatic eliminator 49 is adapted to generate ion and inject ozone to the PWBs 9a when the uppermost one of the overlapped PWBs 9a is separated by the supplying carriage means 27, thereby to prevent electrostatic absorption of the PWBs 9a.

The entire mechanical system as shown in FIG. 1 is enclosed by a cover means which protects the mechanism from dust and blocks the external light. This cover means can be partially opened at a portion corresponding to the cassette unit 31.

Figure 2:
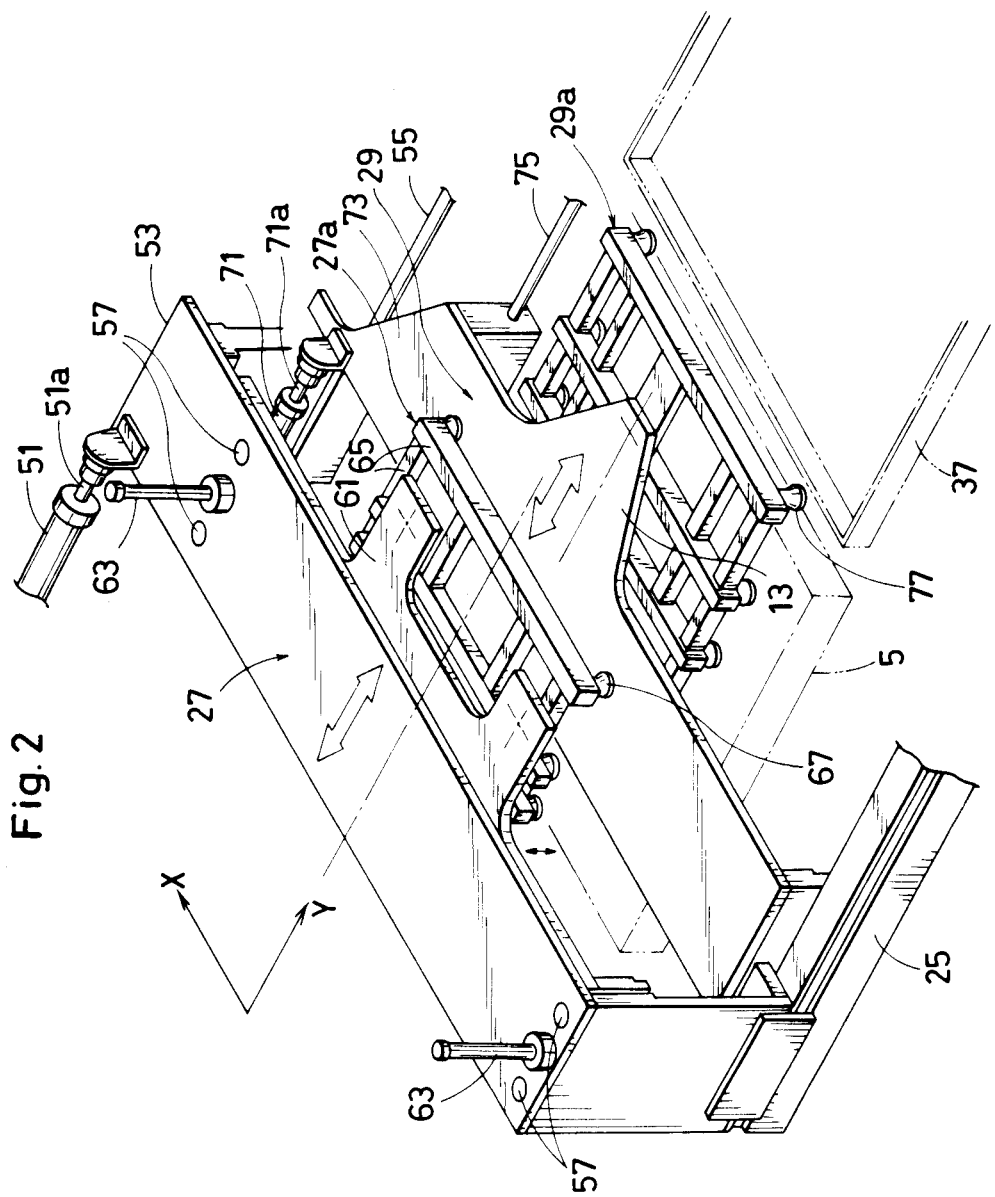
FIG. 2 is an enlarged perspective view showing a PWB carriage system.
Figure 3:
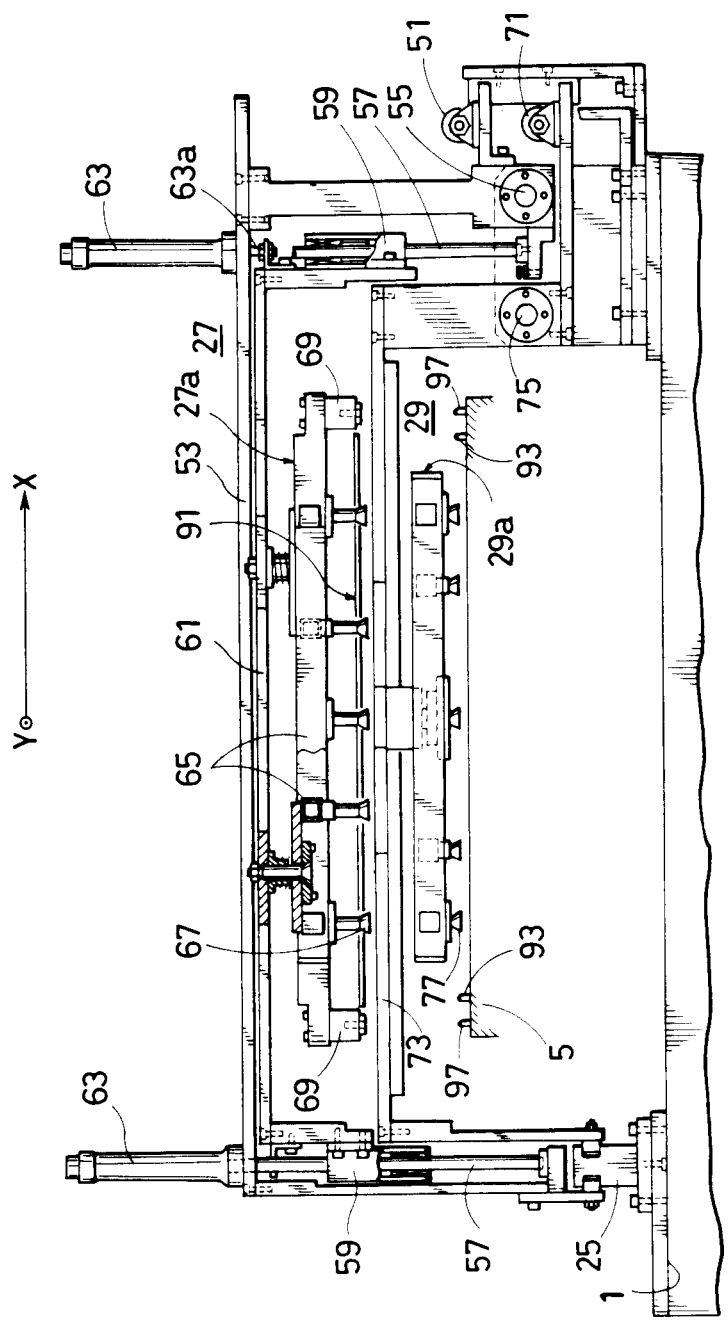
FIG. 3 is a front elevational view of the PWB carriage system as viewed in a Y-axis direction.

FIGS. 2 and 3 are illustrations for showing the PWB carriage means in more detail, and particularly FIG. 3 definitely and obviously shows vertical positional relation between the supplying carriage means 27 and the discharging carriage means 29. Although FIGS. 2 and 3 are slightly different in structure from each other, it is to be noted that FIG. 2 is a perspective view for facilitating ready understanding of the invention and FIG. 3 is a definite design drawing, and the present invention is to be understood on the basis of FIG. 3.

In FIGS. 2 and 3, the supplying carriage means 27 is driven by a driving cylinder 51. An actuator 51a of the driving cylinder 51 is coupled with a substantially π-shaped driven member 53. An end of one of the legs of the driven member 53 is guided by the guide rail 25 while and end of the other leg is smoothly guided by a guide bar 55 which extends through the same along the Y axis. The driven member 53 is provided with two pairs of guide poles 57 fixed to the same perpendicularly to the frame 1 to be connected with a suction pipe frame fixing plate 61 through pole bushes 59. The driven member 53 is further provided in its upper portion with a pair of driving cylinders 63, actuators 63a of which are coupled with the suction pipe frame fixing plate 61. When the driving cylinders 63 are operated, the suction pipe frame fixing plate 61 to which the suction pipe frame 26a is fixed is smoothly moved in the vertical direction along the guide poles 57. The two pairs of guide poles 57 are adapted to accurately secure flatness of this vertical movement. The suction pipe frame 27a is basically formed by hollow frame members 65 and bell-shaped sucking members 67 of rubber, and is connected with a vacuum system (not shown). When the vacuum system is operated, the sucking members 67 absorb the PWBs thereby to retain the same by the suction pipe frame 27a.

The discharging carriage means 29 is formed in a substantially similar manner to the supplying carriage means 27, and is driven by a driving cylinder 71, whose actuator 71a is coupled with a discharging driven member 73. An end of one of the legs of the driven member 73 is guided along the inner side of the guide rail 25, while an end of the other leg is smoothly driven by a guide bar 75 extending through the same along the Y axis. The suction pipe frame 29a is fixed to the driven member 73. The suction pipe frame 29a is substantially similar in structure to the aforementioned suction pipe frame 27a with bell-shaped sucking members 77 of rubber being provided in its lower portion, and is coupled with a vacuum system (not shown) for absorbing and retaining the PWBs by operation of the vacuum system. Although not shown in the drawings, a small-sized driving cylinder is provided for vertically moving the suction pipe frame 29a with respect to the driven member 73 by a slight distance, e.g., several millimeters, to be operated when, e.g., the PWBs are removed from the table 5.

Figure 6:
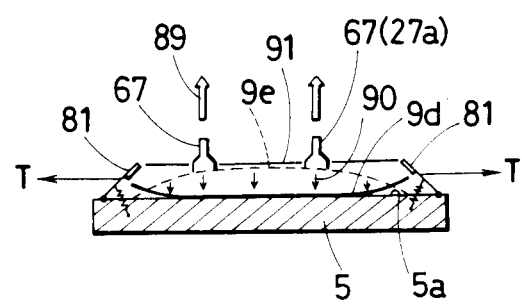
FIG. 6 is a conceptual diagram illustrative of a method for correcting deformation of PWBs.

FIG. 4 is a perspective view showing the table 5 for carrying the PWBs, which are retained on the upper surface 5a thereby by vacuum absorption. Therefore, the table 5 is coupled with a vacuum system (not shown), and the upper surface 5a thereof is provided with small holes (not shown) for absorption at regular intervals. Although it is well known in the art to retain PWBs by vacuum absorption, the feature of the table 5 in the present invention resides in that PWB presser plates 81 are provided for pressing marginal portions of the PWBs as shown in FIG. 4. For example, a substrate base of a PWB is generally formed by glass epoxy material, and such substrate is not necessarily completely flat and may be in the form of, e.g., a smooth arch as illustrated in Fig. 6. The PWB presser plates 81 are adapted to press marginal portions of such warped or deformed PWB against the upper surface 5a of the table 5 thereby to effectively facilitate vacuum absorption, whereby excellent flatness of the PWB is secured.

As shown in FIG. 4, the PWB presser plates 81 are provided on both sides along the X axis and one side along the Y axis. The three presser plates 81 are formed in an identical manner with each other, and are fixed to shaft members 85 rotatably provided in grooves 83 defined in the table 5 by, e.g., screws as shown in FIG. 5. Both end portions of the respective shaft members 85 are provided with coiled springs (not shown), which normally close the presser plates 81 to be in parallel with the upper surface 5a of the table 5. When the presser plates 81 are to be opened as shown by two-dot chain lines, grooved pulleys 87 provided in the central portions of the shaft members 85 are pulled by, e.g., wires wound around the same. Operations for opening and closing the presser plates 81 are controlled in an interlocking manner with operations of the aforementioned PWB carriage means 27 and 29.

Figure 5A:
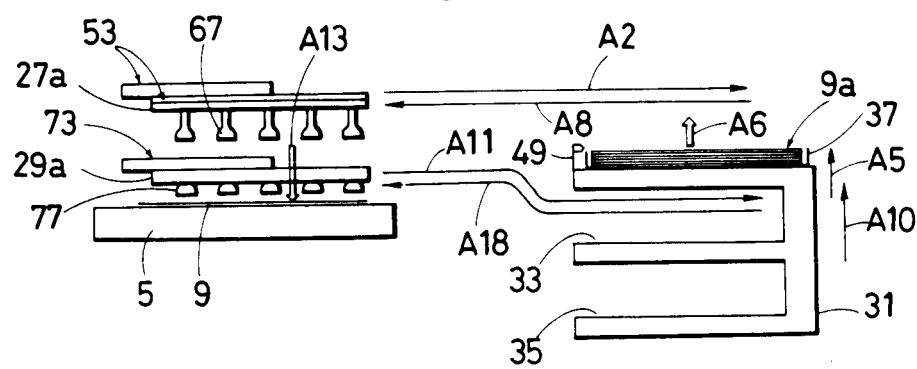
FIGS. 5A and 5B are illustrative operations for carrying PWBs.
Figure 5B:
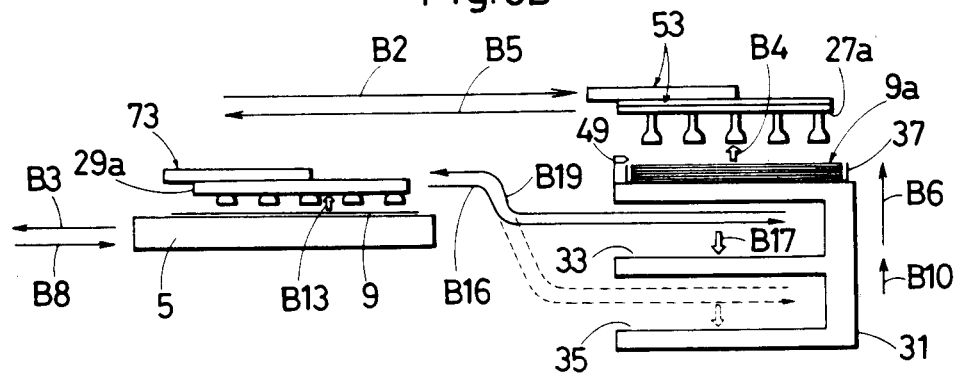

FIGS. 5A and 5B are illustrations explanatory of operations of the carriage system for the PWBs. Description is now definitely made on operations for supplying the PWBs to and discharging the same from the table with reference to FIGS. 5A and 5B. A series of operations as described below are controlled by programs in a computer as hereinafter described. The computer outputs prescribed control signals at prescribed timings, thereby to control driving portions of corresponding driven means.

The mechanical system is first initialized, whereby air pressure etc. are checked and a supplying suction pipe frame 27a and a discharging suction pipe frame 29a are upwardly moved. Then, a supplying carriage plate 53 (corresponding to the aforementioned driven member and including a suction pipe frame fixing plate 61) and a discharging carriage plate 73 (corresponding to the aforementioned another driven member) are both moved to positions over a table 5 which is in an initial position. An image pickup block 11 is locked in a −X axis direction.

Key input of prescribed terms is made by an operator, whereafter an operation for setting a first PWB is started by an initiation command. The following description is made with respect to (A) operation for setting PWBs and (B) operation for inspecting and discharging the PWBs and in accordance with numbered operation units corresponding to the sequence of flow charts.

(A) Operation for Setting PWBs
  (A1) A cassette unit 31 is moved to a predetermined reference position.
  (A2) The supplying carriage plate 53 is moved to a position over the cassette unit 31.
  (A3) The suction pipe frame 27a is downwardly moved.
  (A4) An electrostatic generator 49 is turned on.
  (A5) The cassette unit 31 is upwardly moved to a predetermined PWB supplying position.
  (A6) The suction pipe frame 27a is driven to perform vacuum absorption.
  (A7) The suction pipe frame 27a vacuum-absorbing a PWB 9a is upwardly moved.
  (A8) The supplying carriage plate 53 is moved tward the table 5, to be stopped at a position over the table 5.
  (A9) The electrostatic generator 49 is turned off.
  (A10) The cassette unit 31 is moved to a position for discharging fine PWBs, i.e., to a position for receiving the discharging carriage plate 73 in a container 33.
  (A11) The discharging carriage plate 73 is moved toward the cassette unit 31, to be received in the container 33.

(A12) PWB presser plates 81 provided in the table 5 are opened.
(A13) The supplying suction pipe frame 27a is downwardly moved.
(A14) Vacuum absorption of the table 5 is started.
(A15) Vacuum absorption by the suction pipe frame 27a is released.
(A16) The suction pipe member 27a is upwardly moved toward the carriage plate 53.
(A17) The PWB presser plates 81 are closed.
(A18) The discharging carriage plate 73 is moved from the cassette unit 31 to a position over the table 5.

Referring now to FIG. 6, description is now made on a method of correcting deflection of PWBs placed on the table 5 thereby to set the same on a table surface 5a in good flatness. As hereinabove described, the PWBs may be convexly deformed as shown in the solid line at 9d and concavely deformed as shown in the phantom line at 9e. The convexly deformed PWB 9e is mechanically pressed strongly against the table 5 by a sucking portion 67 of the supplying suction pipe frame 27a which is downwardly moved while strong vacuum absorption is made as indicated by an arrow 89 so that a flat presser plate 91 is in contact with the PWB 9e thereby to downwardly press the PWB 9e entirely in a uniform manner as indicated by an arrow 90. With the vacuum absorption in the table 5 side, the PWB 9e is brought substantially evenly in contact with the upper surface 5a of the table 5. Then the PWB presser plates 81 provided in the table 5 are closed to facilitate the vacuum absorption of the table 5, thereby to secure good flatness. With respect to the concavely deformed PWB 9d, the presser plate 91 may be partially operated around the marginal portions of the PWB 9d, whereas vacuum absorption can be basically performed effectively only by the PWB presser plates 81. Although its fixation manner is not shown, the aforementioned flat presser plate 91 is fixed to the suction pipe frame fixing plate 61 for supporting the suction pipe frame 27a, and is so arranged as to be positioned at a distance slightly separated, e.g., by 5 mm from the lower end of the sucking member 67 when the same is in a natural state which is not elastically deformed.

As hereinabove described, the PWBs can be effectively vacuum-absorbed over the entire area of the table 5 by the pressing mechanism formed by the flat presser plate 91 provided in the supplying carriage plate 53 and the PWB presser plates 81 provided in the table 5, whereby flatness of the PWBs can be accurately secured. Thus, the image pickup block 11 (see FIG. 1) is prevented from focus misalignment of respective cameras provided therein, whereby fine image pickup signals can be continuously obtained.

Description is now made on the operation for discharging the PWBs with reference to FIG. 5B.
(B) Operation for Inspecting and Discharging PWBs
(B1) The cassette unit 31 is first moved to its reference position.
(B2) The supplying carriage plate 52 is moved toward the cassette unit 31.
(B3) The table 5 is started in a −Y direction to perform inspection on the forward side.
(B4) The supplying suction pipe member 27a absorbs and retains a PWB 9a to be subsequently inspected.
(B5) The supplying carriage plate 53 is moved toward the table 5.
(B6) The cassette unit 31 is moved to the position for discharging fine PWBs.
(B7) The image pickup block 11 is released from locking and indexingly driven in the X-axis direction to be locked again.
(B8) The table 5 is started in the Y-axis direction.
(B9) Inspection is performed on the backward side while the PWB is marked at defective positions by the marking unit 15.
(B10) When the aforementioned marked positions are in excess of a predetermined number, the cassette unit 31 is moved to a position for discharging defective PWBs, i.e., to a position for receiving the discharging carriage plate 73 in the container 35.
(B11) The PWB presser plates 81 are opened.
(B12) The discharging suction pipe frame 29a is downwardly moved.
(B13) The discharging suction pipe frame 29a is driven to perform vacuum absorption.
(B14) Vacuum absorption of the table 5 is released.
(B15) The suction pipe frame 29a retaining the PWBs is upwardly moved.
(B16) The discharging carriage plate 73 is moved toward either the container 33 or 35 of the cassette unit 31.
(B17) The discharging suction pipe frame 29a is downwardly moved to release the vacuum absorption and the PWB is received in the cassette unit 31, whereafter the suction pipe frame 29a is upwardly moved.
(B18) The supplying suction pipe frame 27a retaining the PWB by absorption and being in a standby state on the table 5 is downwardly moved to set the PWB on the table 5 in a similar manner to the above.
(B19) The discharging carriage plate 73 is moved from the cassette unit 31 toward the table 5, to be stopped over the same.

As obvious from the aforementioned operation sequence, the supplying carriage means 27 is adapted to retain, during inspection of the PWBs, PWBs to be sequentially inspected over the starting position of the table 5 to be in a standby state until the inpsection is completed thereby to improve throughput in inspection of the PWBs. Since the carriage means 29 is exclusively adapted to discharging and the PWBs are brought in the standby state over the starting position of the table 5 during inspection, the PWBs can be immediately discharged upon completion of the inspection, whereby the throughput is further improved. In other words, the time required for the entire inspection processes can be remarkably reduced by the PWB automatic carriage means as hereinabove described.

Generally in automatic pattern inspection of PWBs, the inspection itself has been subjected to high-speed operation with development in electronic devices and system techniques, whereas much time has been required for housekeeping of the PWBs to be inspected, leading to obstruction in the inspection steps. Such disadvantages are effectively removed by the aforementioned PWB automatic carriage means. With respect to the inspection speed in the aforementioned embodiment, the inspection time is 80 seconds and the time for automatically carrying the PWB is 40 seconds.

While the inspection efficiency is thus improved, there rises a problem in accuracy of positioning the PWBs with respect to the table 5. Particularly in a system for performing pattern inspection in image data correspondence such as the aforementioned embodiment, high accuracy is required for repeatability in positioning of the PWBs on the table 5, so as to prevent primary inspection errors, i.e., errors caused by those in mechanical PWB setting positions previous to data matching in relation to electronic control.

Generally in inspection of the aforementioned type, mechanical positioning of the PWB is performed by utilizing a pair of positioning holes previously formed in the PWBs during producing steps thereof and providing taper pins in the table 5 to be in engagement with the positioning holes. The present invention basically employs such a pin-and-hole system, whereas primarily important is positioning of the automatic carriage means as employed.

Figure 7:
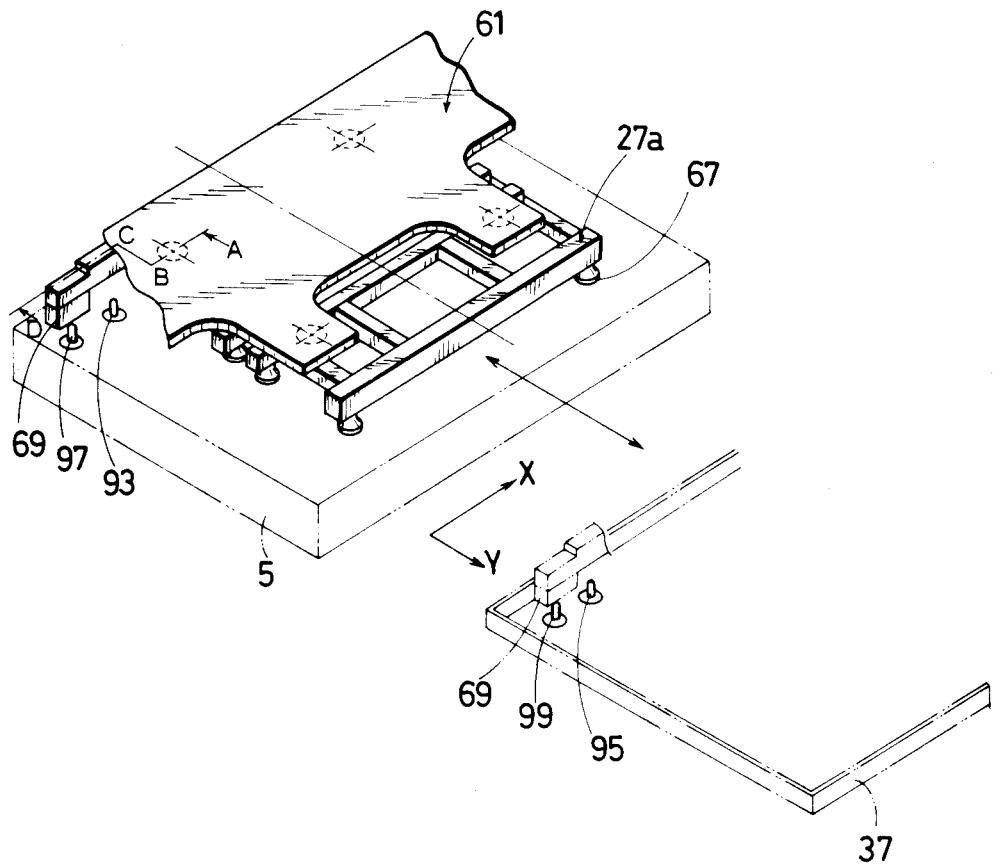
FIG. 7 illustrates a mechanism for accurately positioning PWBs on the table.
Figure 7A:
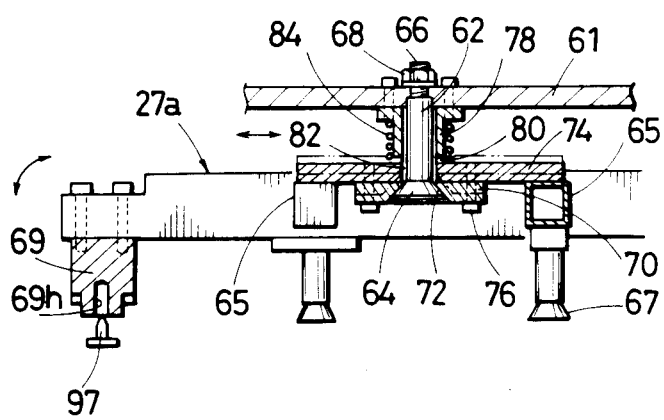
FIG. 7A is a sectional view of the essential part taken along the line A—B—C—D in FIG. 7.

FIG. 7 is a perspective view illustrative of such positioning and FIG. 7A is a cross-sectional view taken along the lines A—B—C—D for illustrating the essential part. In FIG. 7, reference numeral 93 indicates a pair of positioning taper pins upwardly formed on the table 5 for engagement with holes in the PWBs and numeral 95 indicates positioning taper pins provided in the upper stage cassette 37 of the cassette unit 31 for engagement with the holes of the PWBs. The taper pins 93 and 94 are aligned with a straight line which is in parallel with the Y axis. The holes of the PWBs are manually engaged with the taper pin 95 when the same are held in the aforementioned upper stage cassette 37.

Further, taper pins 97 are upwardly provided on the table 5 and taper pins 99 are upwardly provided on the upper stage cassette 37 for positioning the carriage system. The taper pins 97 are provided on a straight line connecting the taper pins 93 for the PWBs in a parallel manner to the X axis, so that the pins 93 and 97 are in constant positional relation with each other. On the other hand, the taper pins 99 are provided on a straight line connecting the taper pins 95 for the PWBs, so that the pins 95 and 99 are in constant positional relation with each other similarly to that in the taper pins 93 and 97. In an opposite manner to these positioning taper pins 97 and 99 for the carriage system, the suction pipe frame 27a is provided with positioning member 69 having holes 69h for engagement with the taper pins 97 and 99. Relative relations between the carriage plate 27, the positioning member 69, the table 5, the PWB positioning pin 93 and the carriage system positioning pins 97 are also shown in FIG. 3.

In basic operation, the suction pipe frame 27a is downwardly moved over the cassette 37 so that the pins 99 are engaged in the positioning members 69, whereby the suction pipe member 27a is moved toward the table 5 while holding the PWBs. Then the suction pipe frame 27a is downwardly moved over the table 5 so that the pins 97 are engaged in the positioning members 69, and the positioning holes in the PWB are simultaneously automatically engaged with the PWB positioning pins 93 whereby the PWB is positioned on the table 5.

However, since engagement between the pins 99 or 97 and the positioning members 69 is not appropriately effected if the pins 99 or 97 are not substantially coaxially aligned with the holes 69h of the positioning members 69. The absorbing member 27a is thus made finely movable entirely in the horizontal and vertical directions for effecting the said engagement.

FIG. 7 is illustrative of the aforementioned finely movable structure of the suction pipe frame 27a and operation thereof. Numeral 62 indicates a shaft member having a conical male member 64 in its lower portion, which is fixed to the suction pipe frame supporting plate 61 by a nut 68 at a thread portion 66 formed in its upper portion. Numeral 70 indicates a conical femal member having a conical female hole 72 appropriately engageable with the conical male member 64, which is fixed to the lower portion of a receiving member 74 fixedly provided in a frame member 65 by screws 76. Numeral 78 indicates a spacer fixed to the supporting plate 61 by screws, which defines a clearance 80 with the aforementioned receiving member 74. Further, a ring-shaped space 82 is defined between the receiving member 74 receiving the shaft member 62 and the shaft member 62. A coiled spring 84 for shock absorption is provided between the flange portion of the spacer 78 and the receiving member 74.

The entire suction pipe frame 27a is fixedly supported by the suction pipe frame supporting plate 61 in a normal state by close engagement of the conical male member 64 with the conical female member 70. If the pins 97 and the pin holes 69h are not coaxially aligned with each other upon downward movement of the suction pipe frame 27a with the supporting plate 61, margins of the pin holes 69h are partially brought into contact with the tapered portions of the pin 97, whereby the entire suction pipe frame 27a is upwardly moved to fill up the clearance 80 as shown by the two-dot chain lines in FIG. 7. Then the conical femal member 70 is disengaged from the conical male member 64 so that the entire suction pipe frame 27a is freely movable in the horizontal direction by the ring-shaped space 82. In other words, the contact points of the pin holes 69h in the positioning members 69 may be downwardly slidably moved along the tapered portions of the pins 97. Upon coaxial alignment thus attained, the pins 97 and the pin holes 69h are smoothly engaged with each other by tare weight of the suction pipe frame 27a. Similar operation is performed in the upper stage cassette 37, whereby the positioning members 69 are smoothly engaged with the pins 99, so that the suction pipe frame 27a absorbs the PWBs thus positioned continuously at a constant position.

The suction pipe frame 27a of the supplying carriage means 27 can be thus finely moved in the horizontal direction, and sufficient positioning accuracy is secured by the positions of the pins 99 for starting carriage and pins 97 for completing the carriage, whereby accuracy of the mechanism under carriage can be substantially disregarded. In other words, the supplying carriage means 27 can be provided in relatively rough, i.e., simple structure, leading to reduction in cost and faster carriage. However, positioning is highly accurately performed at the terminating position conveniently in the inspection system of the aforementioned type.

The PWB to be inspected by the present embodiment is about 0.1 to 1.0 mm in thickness. Therefore, the inspection table 5 is made finely movable in the vertical direction correspondingly to the thickness of the PWB, in order to prevent focus misalignment in image pickup by the vertically fixed image pickup block 11 (see FIG. 1).

Figure 8A:
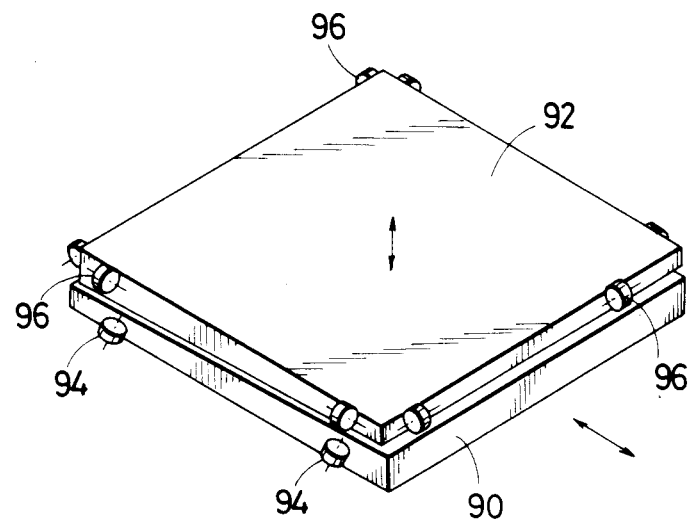
FIGS. 8A and 8B are illustrations showing a mechanism for vertically moving the table.
Figure 8B:
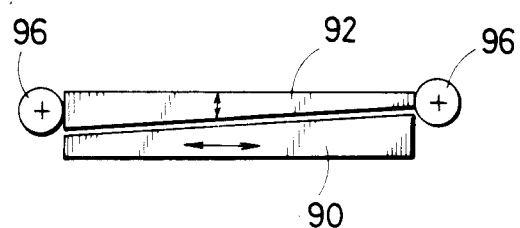

However, since the PWB is of large area, the inspection table 5 is specifically required to be uniformly and evenly movable at any desired position in the vertical direction. In order to effect such movable structure, the present embodiment employs wedge engagement, the principle of which is shown in FIG. 8. Namely, a lower wedge member 90 is reciprocatingly moved in a horizontal direction while an upper wedge member 92 is vertically finely moved through wedge engagement. Movement of the lower wedge member 90 is horizontally guided by fixed lower wedge guide members 94 and that of the upper wedge member 92 is vertically guided by fixed guide members 96. The upper and lower wedge members 92 and 90 are located within the table 5, and the lower wedge member 90 is horizontally moved by a motor and gear mechanism.

The inspection table 5 is thus uniformly and evenly moved in the vertical direction with respect to the PWB 10 in thickness of 0.1 to 1.0 mm, whereby the plane regarding inspection (inspection plane) is continuously retained at constant height so as to prevent focus misalignment in image pickup operation.

In substitution for the structure for vertically moving the inspection table, an automatic focus control device may be employed for automatically adjusting delivery and subtraction of the image pickup lens in the image pickup block 11 (FIG. 1). However, such substitution is merely suggestive of possibility in technical implementation, and is not advantageous in cost.

Description is now made on the electronic control system of the system for inspecting pattern defects of PWBs according to the present invention.

Figure 9:
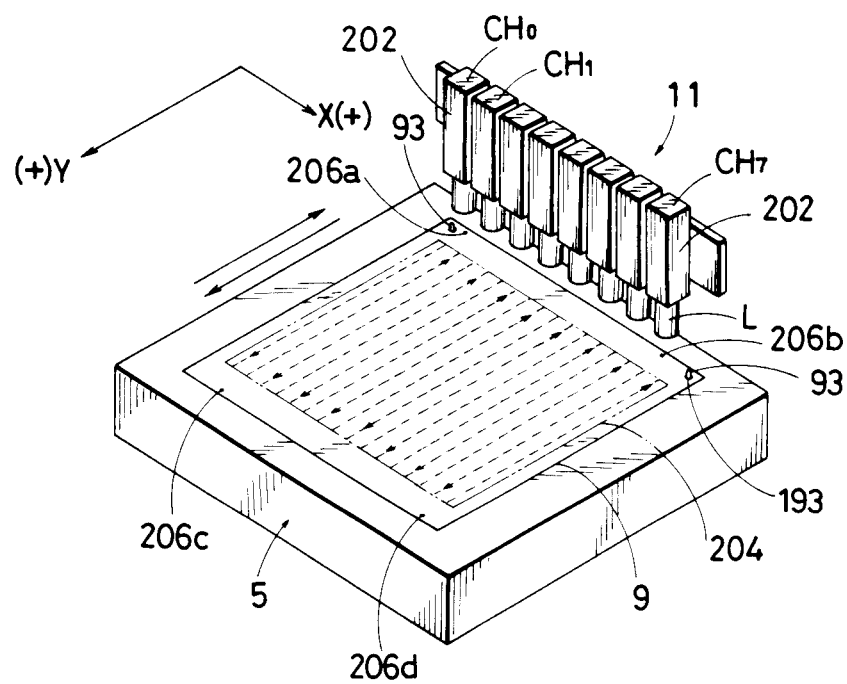
FIG. 9 is a perspective view illustrative of a process for scanning PWBs with respect to an image pickup block.

FIG. 9 is an illustration for typically showing the manner of pattern input operation. A PWB 9 is roughly positioned by a pair of pins 93 provided on a table 5, which is reciprocatingly moved in the Y-axis direction. An integrated image pickup block 11 performs image acquisition of a prescribed apear of the PWB 9 in which a wiring pattern is present. The image pickup block 11 comprises eight CCD cameras 202 which have image forming lenses L in lower portions thereof and respectively contain one-dimensional CCD image sensors of 2048 bits. The one-dimensional CCD image sensors are adapted to scan the PWB in the X-axis direction.

Figure 10:
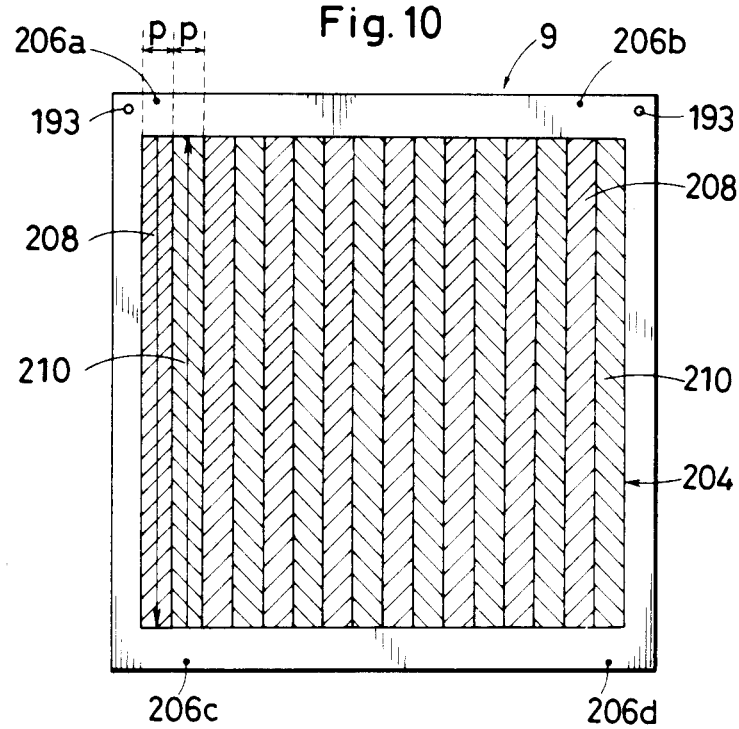
FIG. 10 is an explanatory view showing a PWB applicable to the system according to the present invention.

The eight CCD cameras 202 are defined in the system as channels 0 to 7 successively along the X axis, which are independent from each other including electronic circuits coupled with the CCD cameras. These channels may be exprsed such that the zero channel is CH0, the first channel is CH1, ..., the seventh channel is CH7. The CCD cameras 202 of the respective channels are adapted to scan an inspected apear 204 of the PWB in which the wiring pattern is present in the X-axis direction, i.e., in the main scanning direction over a width of about 32 mm. The sub scanning direction corresponds to the $\pm Y$ axis direction. The table 5 is moved in the $-Y$ axis direction so that the entire image pickup block 11 is indexed by 32 mm in the $+X$ direction at the terminated point, and then the table 5 is moved in the $+Y$ axis direction whereby the entire inspected area 204 is subjected to image acquisition as shown in FIG. 10. It is to be noted that the size of the inspected area 204 is 500 mm $\times$ 500 mm in the present embodiment.

The PWB 9 is previously formed with pairs of positioning or registration marks 206a, 206b, 206c, and 206d on both sides of the inspected area 204 in the Y axis direction. These marks 206a to 206d are so designed as to be in constant positional relation to the wiring pattern and positioning holes 193 in a pattern design process of the PWB 9 employing CAD, and formed through an etching process. Each of the marks 206 a to 206d is in the form of a circle having a diameter of 3 mm. These circular marks 206a to 206d are mainly adapted to highly accurately detect misregistration between a PWB formerly placed on the table 5 and a PWB subsequently placed on the same.

As shown in FIG. 9, the mark 206a is in a position within the range of, e.g., the camera 202 of the channel CH0, and the mark 206b is in a position within the range of the camera 202 of the channel CH7. Upon movement of the table 5 in the $-Y$ axis direction at a fixed speed, the mark 206a is read by the channal CH0 while the mark 206b is simultaneously read by the channel CH7. Both marks 206a and 206b are thus read by the channels CH0 and CH7 thereby to find the amounts of misregistration thereof from reference coordinates defined in the inspection system, i.e., reference positions for the marks 206a and 206b.

Upon entering the ranges of the CCD cameras 202 of the respective channels CH0 to CH7, the inspected area 204 is scanned independently by the eight channels CH0 to CH7 respectively, to be subjected to image acquisition as eight strip-shaped areas 208 in about 32 mm width as shown in FIG. 10.

When the movement of the table 5 in the $-Y$ axis directio is stopped, the entire image pickup block 11 is driven to be indexed by one pitch p, i.e., 32 mm in the X-axis direction. In such an indexed state, the mark 206c is in a position within the range of the channel CH0 CCD camera 202 and the mark 206d is in a position within the range of the channel CH7 CCD camera 202. Then, upon movement of the table 5 in the $+Y$ axis direction at a fixed speed, the mark 206c is read by the channel CH0 while the mark 206d is simultaneously read by the channel CH7. Also in such backward movement, amounts of misregistration from the reference coordinates defined in the inspection system are found on the basis of reading of the marks before the inspected ares 204 comes in the ranges of the respective channels, similarly to the forward movement.

Upon entering the ranges of the respective channels in the backward movement, the inspected area 204 is independently scanned by the eight channels CH0 to CH7 respectively, to be subjected to image acquisition as strip-shaped areas 210 of about 32 mm width for filling up spaces between the aforementioned eight strip-shaped areas 208.

Thus, the entire inspected area 204 is physically divided into sixteen channels, respective one of which is independently scanned in pixel correspondence. The inspected area 204 is shown in a hatched manner in FIG. 10 for convenience of illustration. Physical channels 210 or 208 hatched in the same direction correspond to Y axis scanning of one direction. Directions of hatching are not indicative of that of scanning lines, and the scanning lines are in a direction along arrangement of the CCD cameras, i.e., perpendicular to the Y axis. The size of the pixel is 16 $\mu$m $\times$ 16 $\mu$m in the present embodiment.

Figure 11:
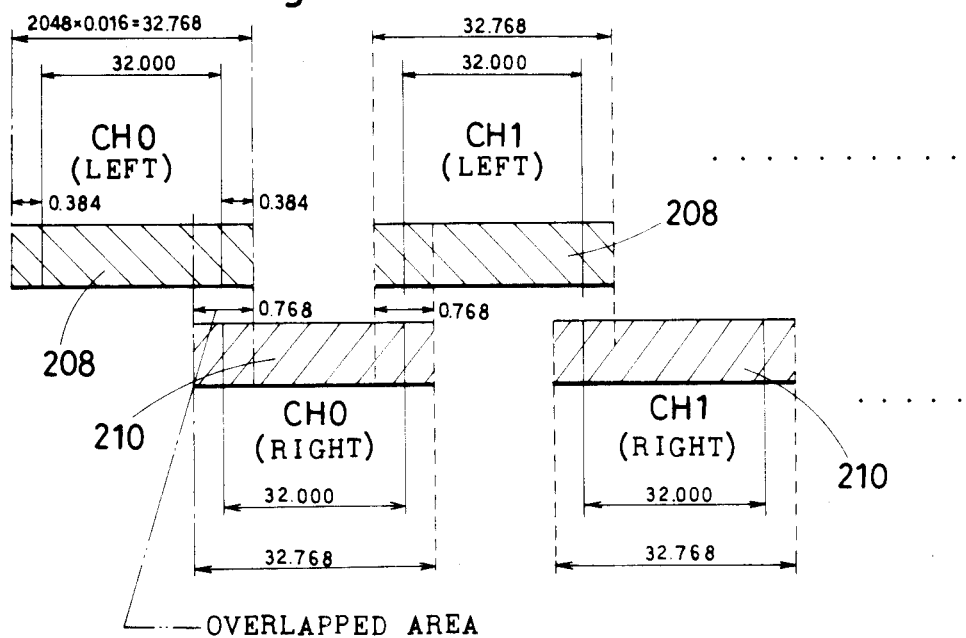
FIG. 11 is a conceptual explanatory view showing that physical channels of PWBs are overlapped to be scanned.

Although the respective channels CH0 to CH7 are described as scanned over the width of about 32 mm in the foregoing description, the actual scanning width is 32.768 mm as illustratively shown in FIG. 11. Further, adjacent physical channels 208 and 210 are overlapped with each other by 0.768 mm to be scanned in the forward and backward movement, thereby to relieve such requirements that fixing accuracy of the one-dimensional CCD image sensors contained in the CCD cameras 202 and aligning accuracy of the entire optical system including the image sensors must be set strictly.

As shown in FIG. 10, the PWB is provided with two pairs of marks for detecting misregistration amounts by reading the marks 206c 206d in the backward movement, in order to compensate accuracy in indexing of the image pickup block 11. If such indexing accuracy is remarkably high, the aforementioned marks 206c and 206d are not necessary since the amounts of misregistration can readily be detected by reading only the marks 206a and 206b in the forward movement.

Figure 12:
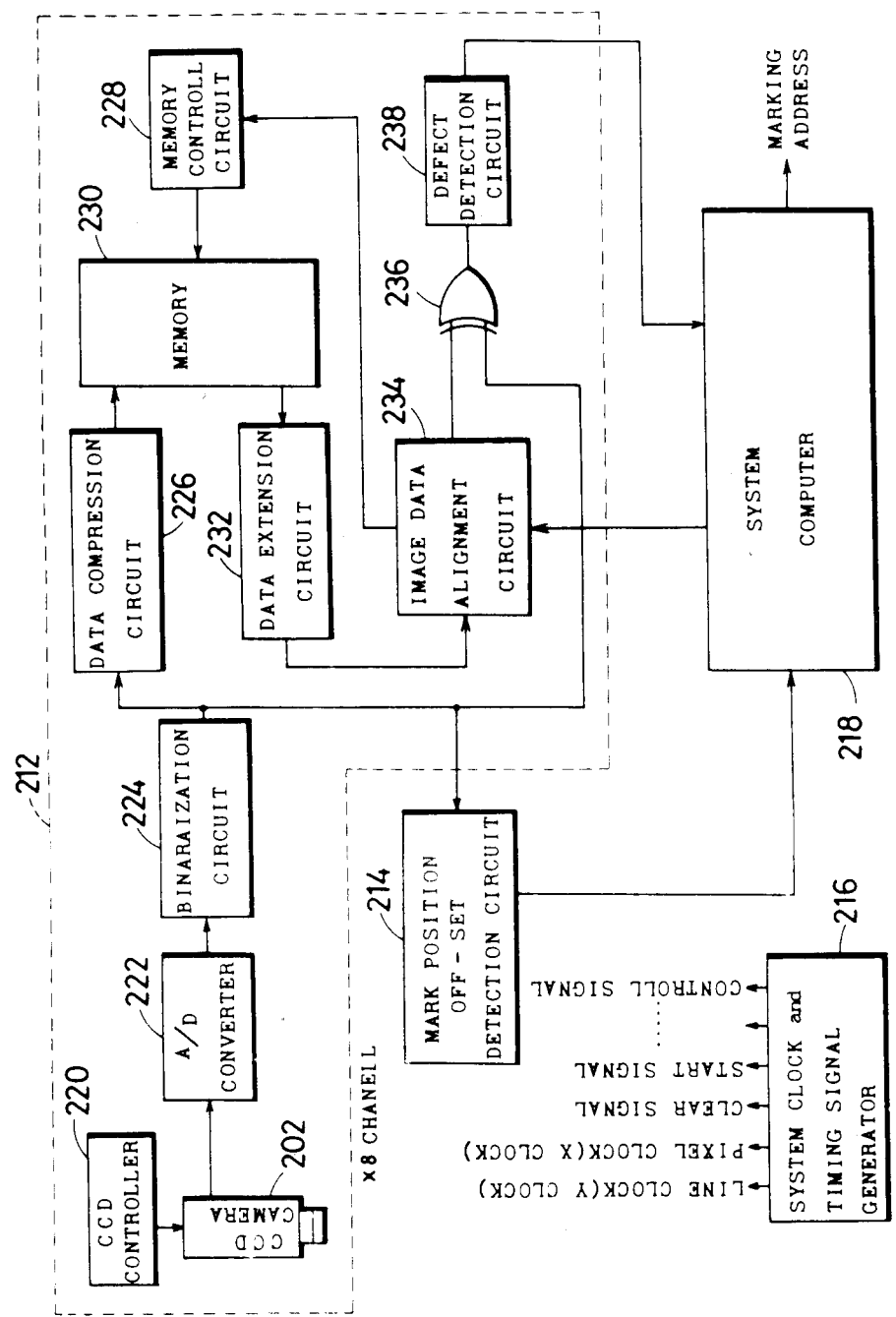
FIG. 12 is a schematic block diagram showing an electric system according to an embodiment of the present invention.

FIG. 12 is a schematic block diagram showing an electric system for inspecting pattern defects. A circuit block 212 shown by the broken line indicates a circuit block coupled to one CCD camera 202, provided in eight channels in the system according to the present invention. The circuit block 212 is adapted, with respect to two PWBs to be inspected by comparison, to compare data of corresponding pixels in two physical channels of forward and backward scanning, thereby to output defect data on the basis of results of the comparison.

A mark misregistration detecting circuit 214 is connected with the circuit blocks 212 of the channels CH0 and CH7, thereby to detect misregistration amounts of the respective two PWBs from reference coordinates defined in the system.

A system clock/timing signal generator circuit 216 supplies respective circuits forming the circuit block 212 and the mark misregistration detecting circuit 213 with clock signals and required timing signals. The clock signals include line clocks (Y clocks) corresponding to scanning in the Y axis direction, pixel clocks (X clocks) corresponding to scanning in the Y axis direction, pixel clocks (X clocks) corresponding to scanning in the X axis direction, i.e., shift clocks of CCDs of 2048 bits and the like. The timing signals include start signals, clear signals, control signals and the like.

Basically a system computer 218 en bloc controls the circuit blocks 212 for eight channels. Further, the system computer 218 fetches detection data in the mark misregistration detecting circuit 214 to perform operation on the amounts of misregistration of two PWBs thereby to supply the result of the operation to the circuit block 212. On the basis of the data on the result of the operation, image data of the two PWBs are compared in the circuit block 212 by corresponding pixel data, whereby the computer 218 fetches defect data based on the comparison. The computer 218 outputs marking addresses corresponding to defective positions to the marking unit 15 as shown in FIG. 1, which in turn performs marking on the PWBs under inspection. Although not shown in FIG. 12, the system computer 218 is generally formed by a CPU, a main memory, a system disc unit, a keyboard input unit, an input/output control unit, a CRT monitor etc. which are interconnected through a common bus.

In the circuit block 212, the CCD camera 202 comprising one-dimensional image sensor of 2048 bits is controlled by a CCD control circuit 220 to serially output analog image signals, which are amplified within the CCD camera 202 to be inputted in an A-D converter 222. The A-D converter 222 converts the analog image signals to digital signals of, e.g., 6 bits, thereby to output the same to a binarization circuit 224.

The binarization circuit 224 produces, on the basis of the aforementioned digital signals, binary signals "1" and "0" corresponding to the brightness of the pixels. Accuracy of the binary signals is improved by two-stage binarization. In the first stage, a high-level threshold and a low-level threshold are set with respect to the aforementioned 6-bit digital signals, thereby to set signals exceeding the high-level threshold as "1" and signals less than the low-level threshold as "0". With respect to signals at an intermediate level, decisions as to "1" and "0" are made by a follow-up floating method employing a two-dimensional space filter of 5×5 by setting an intermediate level threshold and a floating threshold deciding constant. Accurate binary signals are thus obtained by such method, and more preferably, the obtained binary signals are subjected to smoothing processing in order to eliminate quantization errors. For example, a signal array of 3×3 is subjected to one-bit irregularity correction. Since most of the wiring patterns of PWBs are linearly formed in the vertical and horizontal directions, such smoothing processing is effective for reducing in advance probability of mismatching caused in subsequently performed data matching. The binary signals obtained in the binarization circuit 224 are outputted to a data compression circuit 226. It is to be noted that the binary signals from the binarization circuits 224 of the channels CH0 and CH7 can be outputted to the mark misregistration detecting circuit 214.

The data compression circuit 226 performs data compression of the binary image signals by employing a run-length coding method. Since the length of one scanning line is 2048 bits at the longest, a scanning line can be expressed by data length of 12 bits. In order to operate the run length, 4-bit slices are employed as counters and carry is utilized for terminators. Further, since the base portion is by far wider than the pattern portion as a specific character of the PWB, the run length is provided as variable length, not as fixed length.

The binary image data compressed in the data compression circuit 226 are stored in a memory 230 which is controlled by a memory control circuit 228. The memory 230 is formed by, e.g., dynamic memory elements, and an address space thereof is formed in a circular manner with respect to stored data as shown in a conceptual diagram of FIG. 13. Image data corresponding to the strip-shaped areas 208 in FIG. 10 are stored in addresses A1 to A2 and image data corresponding to strip-shaped areas 210 are stored in addresses A3 to A4.

Storage data 208m and 210m in the memory 230 are read when a subsequent PWB is scanned. In FIG. 12, when the binarization circuit 224 outputs binary signals regarding the subsequent PWB, the mark misregistration detecting circuit 214 detects misregistration of this PWB with respect to the reference coordinates in the system, whereby the detected data are inputted in the computer 218. Simultaneously with input of the data, relative misregistration of the former and subsequent PWBs is operated by the misregistration data of the former PWB, thereby to find the amount of misregistration of the former PWB with respect to the subsequent PWB, i.e., on the basis of the position of the subsequent PWB as reference. The data on the amount of misregistration thus found are inputted in an image data alignment control circuit 234.

When an inspected area 204 of the subsequent PWB is about to be within the range of the CCD camera 202, the image data alignment control circuit 234 supplies control signals to the memory control circuit 228 on the basis of data on the amount of misregistration, thereby to control reading of the memory 230. In other words, control is performed by the said control signals with respect to a reference reading timing as to whether reading operation is performed faster or slower.

The compressed image data read from the memory 230 are restored to original image data by a data expanding circuit 232. The restored image data are inputted in the image data alignment control circuit 234, which in turn controls alignment of the image data in units of scanning lines on the basis of the aforementioned data on the amount of misregistration.

An exclusive OR circuit 236 compares the outputs from the binarization circuit 224 and the image data alignment control circuit 234 in units of pixel data. Both pixel data thus subjected to comparison are suited, as the result of control by the image data alignment control circuit 234, to corresponding pixels of the both PWBs. Namely, space misregistration of the bot PWBs is compensated by replacement to time misregistration by the image data alignment control circuit 234. The exclusive OR circuit 236 outputs "0" when the both pixel data are matched with each other and "1" when the same are different from each other, and the outputted data are inputted in a time series manner in a defect detecting circuit 238 of a next stage.

The defect detecting circuit 238 detects pattern defects by employing prescribed defect analysis logics thereby to output detect signals, which include information on coordinate positions of pixels or pixel groups to be inputted in the computer 218.

The defect signals are outputted from the computer 218 when the table 5 is moved in the backward direction, as well as composed with defect signals detected by backward scanning thereby to output marker control signals to the marking unit 15 as shown in FIG. 1 for performing marking in positions, regarded as defective, of the PWB itself by, e.g., ink.

The image data concerning the subsequent PWB are stored in the memory 230. As shown in FIG. 13, when image data 208m and 210m concerning the former PWB are read, the subsequent image data are written in storage areas having completed reading. For example, as shown in FIG. 13, the subsequent image data are written in addresses B1 to B2 and B3 to B4 in substitution for the former image data. Therefore, it is sufficient for the memory 230 for eight channels to have storage capacity capable of storing image data regarding one PWB. Further, since the data to be stored is subjected to data compression, the capacity is reduced by about 1/100 in comparison with storage of image data in units of pixels. Both of the circuits 226 and 232 are basically formed by counter circuits and a few control circuits and can be prepared at low cost, while the capacity of the memory 230 may be remarkably small. In other words, employment of a number of expensive memory elements is not required, leading to reduction in cost and compact circuit structure.

Description is now made on a method of detecting misregistration of the PWB by reading marks for data matching in pixel correspondence with description of the background.

The PWB is positioned on the table by engagement of positioning pins upwardly formed on the table with corresponding holes of the PWB, whereby mechanical positioning is attained in accuracy of 0.1 mm order. However, in order to divide the inspected area of the PWB into pixels of 16×16 μm thereby to check the data in pixel correspondence as in the present embodiment, accuracy of 10 μm, i.e., 0.01 mm is required, and such ten-time gap in accuracy must be considered to securely engage the holes in the PWB with highly accurately set positioning pins. However, although such holes in the PWB are generally formed by a drill, accuracy in formation of the holes itself is relatively rough. Further, when the holes of the PWB are securely engaged with the positioning pins, disengagement of the PWB from the table is extremely difficult, and there rises a problem in flatness of the PWB on the table. In the case where the automatic PWB carriage means is employed as in the present invention, generally the holes of the PWB are made relatively larger in diameter than the pins in the table. In view of these points, it is substantially impossible to attain accuracy of 0.01 mm in mechanical positioning of the PWB. Thus, there may be no effective method of automatically securing the said accuracy without requiring manual operation other than electronically compensating misregistration by reading marks in constant relation with wiring patterns.

Figure 14:
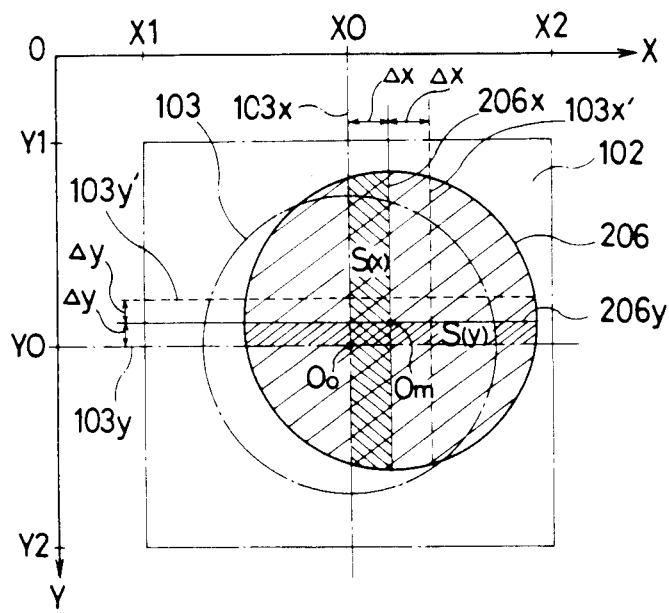
FIG. 14 is illustrative of a principle for reading marks for detecting misregistration thereby to find the amount of misregistration.
Figure 15:
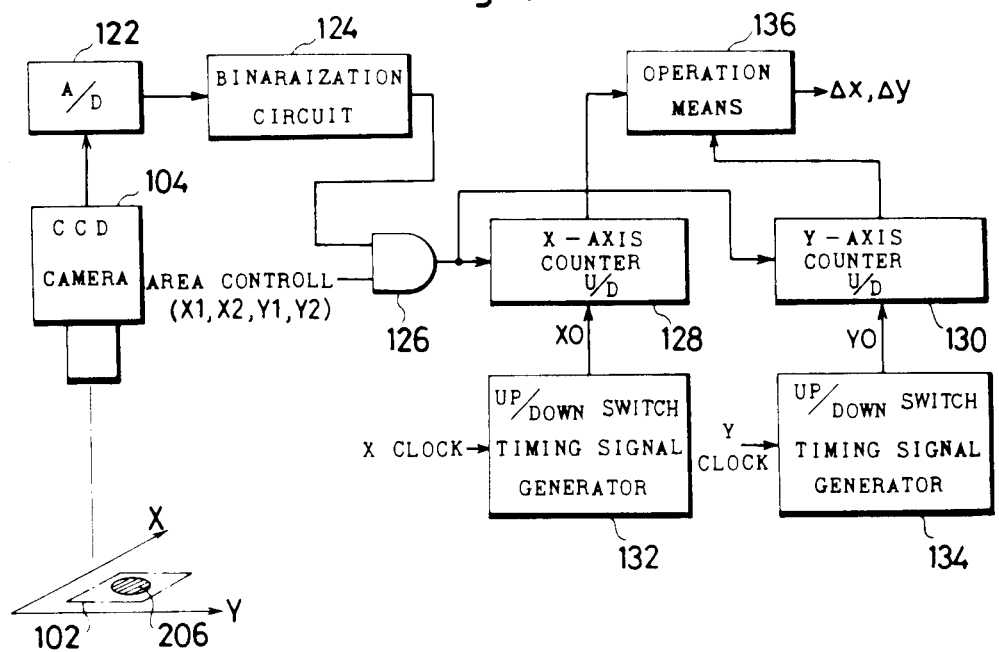
FIG. 15 is a block diagram showing basic circuit structure for reading the marks and detecting misregistration.

FIG. 14 shows the principle of reading a circular mark 206 for detecting misregistration thereof, and FIG. 15 shows a basic block circuit diagram for finding misregistration amounts $\Delta x$ and $\Delta y$. In FIG. 14, a reference point $0_0$ ($X_0$, $Y_0$) is set with respect to absolute coordinates X—Y such that a square area 102 is defined by coordinates ($X_1$, $Y_1$), ($X_1$, $Y_2$), ($X_2$, $Y_2$) and ($X_2$, $Y_1$) about the reference point $0_0$ and the circular mark 206 is necessarily positioned in the square area 102. Reference numeral 103 indicates a virtual circle about the reference point $0_0$, which is identical in diameter to the circular mark 206 and shown for illustration of the principle. This virtual circle 103 shows the position in which the circular mark 206 is to be originally located. When the center $0_m$ of the circular mark 206 is deviated from the center $0_0$ of the virtual circle 103 by $\Delta x$ in the X-axis direction and by $\Delta y$ in the Y-axis direction, the amount $\Delta x$ of deviation corresponds in certain relation to the ares S(x) of a region defined by a reference symmetrical line 103x and a symmetrical line 206x of the circular mark 206. On the other hand, the amount $\Delta y$ of deviation corresponds in certain relation to the area S(y) of a region defined by a reference symmetrical line 103y and a symmetrical line 206y of the circular mark 206. Thus, the values $\Delta x$ and $\Delta y$ can be univocally determined by finding the areas S(x) and S(y).

In FIG. 15, reference numeral 104 indicates a CCD camera serving as image input means, which cans the object of image pickup in the X-axis direction. Scanning in the Y-axis direction is performed by movement of the object of the image pickup in the -Y axis direction. Outputs from the CCD camera 104 are digitalized by an A-D converter 122 and binarized by a binarization circuit 124 to be inputted in a double-input AND circuit 126. The AND circuit 126 receives area control signals in its other input, so as to be activated only when scanning is within the square area 102. The binarization circuit 124 outputs binary pixel signals of "0" to the background and "1" to the circular mark 206. An X-axis updown counter 128 and a Y-axis updown counter 130 respectively independently count the binary pixel signals of "1" concerning the circular mark 206.

An updown switching timing signal generator circuit 132 outputs updown switching signals to the X-axis updown counter 128 at the timing corresponding to the position of the reference symmetrical line 103x of the virtual circle 103 as shown in FIG. 14, i.e., X=XO. The updown switching operation is performed per scanning in the X-axis direction. Therefore, the count values counted in the left-hand side of the reference symmetrical line 103x are exactly cancelled with the count values counted in the right-hand side of a broken line 103x' rightwardly deviated from the symmetrical line 206x by $\Delta x$. As the result, a count integrated value twice the area S(x) is obtained at the updown counter 128 upon completion of scanning of the square area 102.

The updown switching timing signal generator circuit 134 outputs updown switching signals to the Y-axis up-down counter 130 at the timing corresponding to the reference symmetrical line 103y of the virtual circle 103 as shown in FIG. 14, i.e., Y=YO. Such updown switching operation is performed only once in scanning in the Y-axis direction. Therefore, the count values are integrated per scanning in the X-axis direction, whereas the count values integrated in the upper side of a broken line 103y' upwardly deviated by $\Delta y$ from the symmetrical line 206y are exactly cancelled with the count values integrated in the lower side below the reference symmetrical line 103y. As the result, a count integrated twice the area S(y) is obtained at the Y-axis updown counter 130 upon completion of scanning of the square area 102.

Since the area of the circular mark 206 is previously clear, the axis S(x) and S(y) are found by an operation means 136 on the basis of the aforementioned count integrated values, thereby to find the misregistration amounts $\Delta x$ and $\Delta y$. The operation means 136 may be implemented by prescribed operation programs or by a ROM table of integrated data to misregistration amounts in place of the programs for high-speed operation. The switching timing signal generator circuits 132 and 134 can be readily implemented by structure including counters for counting X clocks for advancing scanning in the X-axis direction and Y clocks for advancing scanning in the Y-axis direction respectively.

The misregistration amounts are found by the integrated values in the aforementioned manner for the reason that, since wiring patterns "after etching" are inspected in the pattern inspection of PWBs and the marks for detecting misregistration are also processed by etching similarly to the wiring patterns, the marks may be "thinned" or "chamfered" differently from the conventional case where clear marks are read. In this regard, there is a specific problem in accuracy of detection of misregistration in reading of marks concerning PWBs. It is important that when detection errors per scanning are integrated in a circle having sufficient size for pixels as in the present invention to find average values, the results are in accuracy below the size of one pixel. This is because, when attention is directed to a pixel overlapped with an end of the mark on assumption that the aforementioned conditions are effectuated, there are pixels in the vicinity of the noted pixel in which mark components occupying the pixels are slightly different in rate from each other. In consideration of isotropy of a circle, the rate occupied by the mark is gradually changed in the range of 0 to 100 percent, and in pixels overlapped with the peripheral edge of the mark evenly divided in vertical and horizontal directions, the numbers of the pixels corresponding to the respective range are substantially even. Therefore, error count values (said S(x) and S(y)) during misregistration of the mark by one pixel are changed in a substantially linear manner. Thus, quantization errors are prevented from accumulation by correcting the misregistration employing highly accurate information obtained in the aforementioned manner.

Although the mark 206 previously formed in the PWB is provided in a circular form in the aformentioned embodiment, the mark is not restricted to the circular form and may be in a form having two symmetrical lines which are perpendicular to each other, such as a square form, a rectangular form, a rhombic form and an oval form, in order to detect misregistration regarding parallel movement. However, the aforementioned circular form has such advantages that it is omnidirectionally isotropic about its center and it is not easily thinned nor chamfered by etching.

The specific feature of the aforementioned method resides in that the misregistration amounts $\Delta x$ and $\Delta y$ can be detected in high accuracy below one pixel with simple structure employing symmetricity of the symmetrical mark as well as finding count integrated values by simply switching the updown counters.

Figure 16:
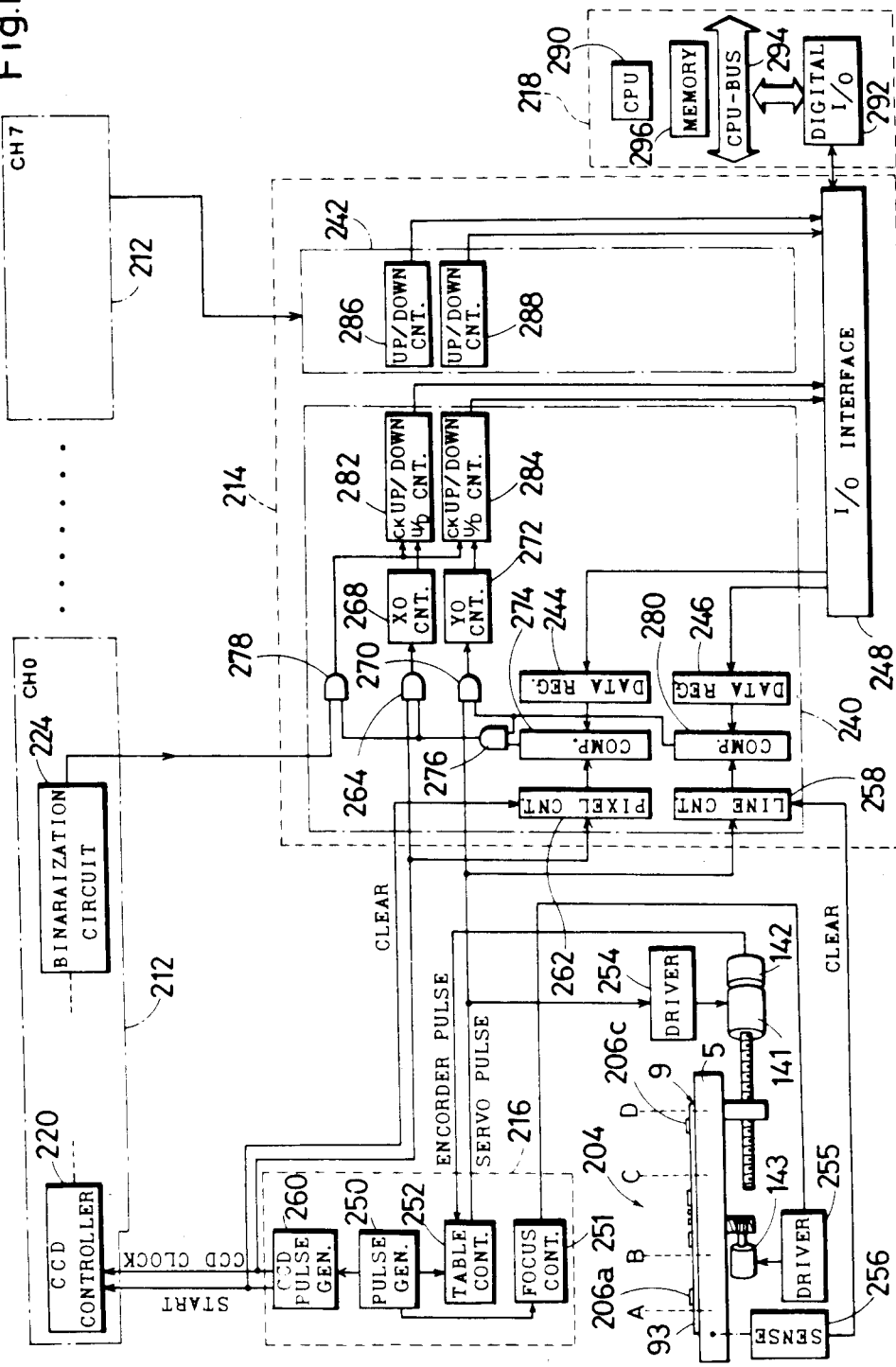
FIG. 16 is a block circuit diagram showing definite structure in which mainly a mark misregistration detecting circuit is applied to the system according to the present invention.

FIG. 16 shows a mark misregistration detecting circuit 214 of the system according to the present invention, to which the aforementioned method is applied, in detail. A circuit 240 is for a channel CH0, and a circuit 242 similarly formed as the circuit 240 is for a channel CH7. Binary signals from a binarization circuit 224 are inputted in the respective circuits 240 and 242. In a data register 244, data on X coordinates of a square area in which a circular mark is positioned and a central coordinate XO thereof are set by a computer 218 through an I/O interface 248. Further, in a data register 246, data on Y coordinates of the square area and a central coordinate YO thereof are set by the computer 218 through the I/O interface 248. In the present embodiment, the size of the square area is 4 mm×4 mm and the diameter of the circular mark is 3 mm, and the centers XO and YO are located in the centers of scanning by the respective channels CH0 and CH7.

Pulses produced in a pulse generator 250 are outputted as servo pulses, i.e., line clocks through a table controller 252, to be supplied to a table driving motor 14 through a motor driver 254. A table 5 is driven to turn on a sensor 256 for a starting point of Y-axis scanning, whereby a line counter 258 for counting the line number is cleared to start counting.

On the other hand, a CCD pulse generator 260 outputs start signals for driving a CCD camera 202, e.g., at a point A to a CCD controller 220, and then outputs CCD clocks, i.e., pixel clocks for advancing photoelectric conversion signals stored in the CCD. The starting signals from the CCD pulse generator 260 are inputted in a pixel counter 262 for counting pixel clocks simultaneously as clear signals, whereby counting operation at the pixel counter 262 is started.

The pixel clocks are further inputted in an XO counter 268 through an AND circuit 264 while the line clocks are inputted in a YO counter 272 through an AND circuit 270.

A comparator 274 compares the contents of the register 244 with those of the pixel counter 262, thereby to input area control signals to an AND circuit 278 through an AND circuit 276 while supplying control signals to a counter 268 through the AND circuit 264. A comparator 280 compares contents of a register 246 and a line counter 258 to input area control signals to an AND circuit 278 through an AND circuit 276 while supplying control signals to the YO counter 272 through the AND circuit 270.

An updown counter 282 initially upcounts pixel signals regarding the circular mark, and is shifted to downcount operation by switching signals outputted when the counter 268 counts XO. Similarly an updown counter 284 initially upcounts pixel signals, and is shifted to down-count operation by switching signals outputted when the counter 272 counts YO.

Updown counters 286 and 288 of the circuit 242 performs updown counting of pixel signals regarding the circular mark as outputted from the channel CH7, similarly to the updown counter 282 and 284 of the circuit 240.

Figure 17:
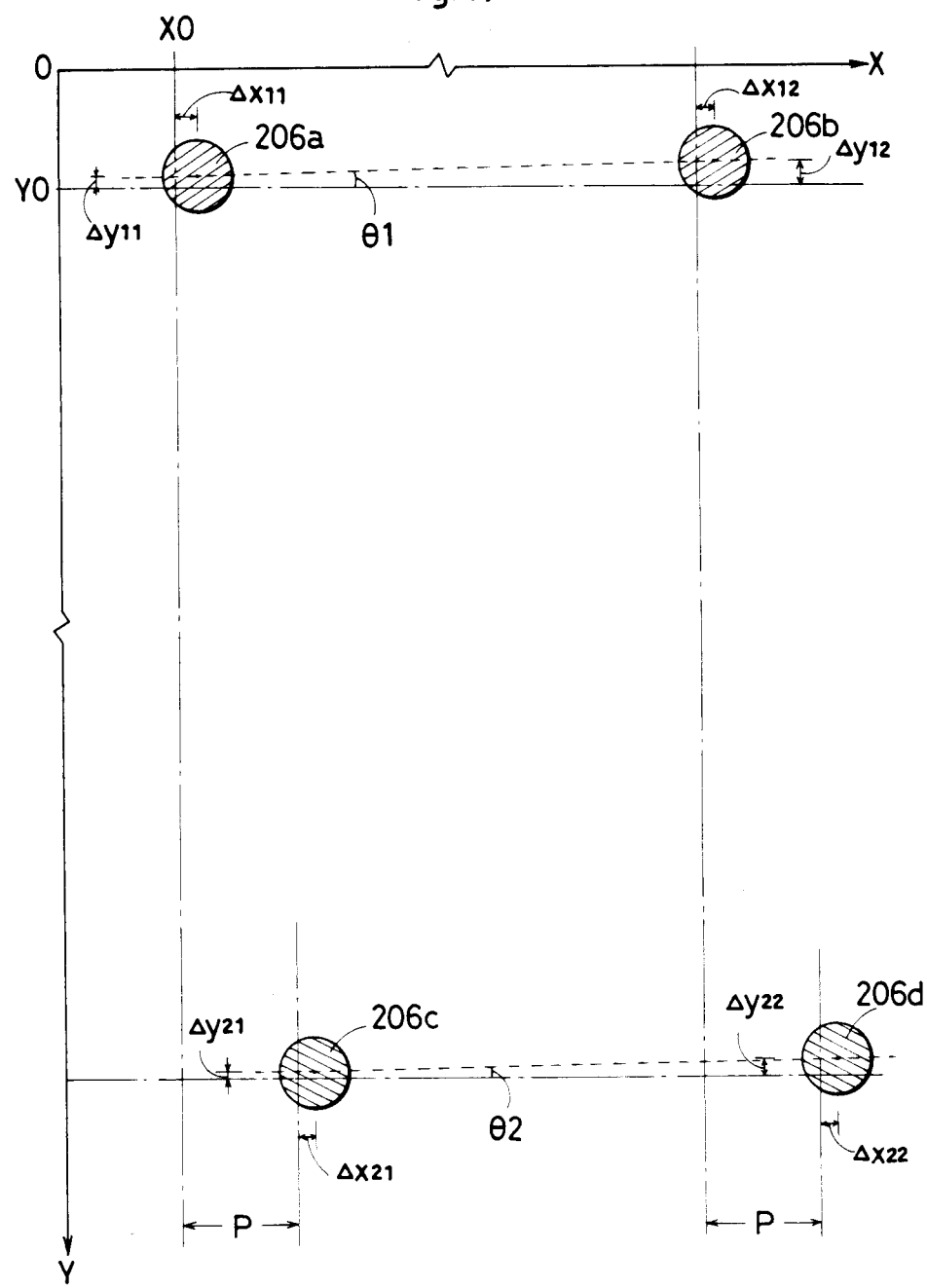
FIG. 17 is a diagram for illustrating deviation of a circular mark from reference coordinates.

When reading of the circular mark is completed, the computer 218 fetches data obtained at the respective counters 282, 284, 286 and 288 through the I/O interface 248. In other words, under control by the CPU 290, the said data are stored from a digital I/O unit 292 in the memory 296 through a CPU bus 294. On the basis of the stored data, the CPU 290 performs operation on misregistration amounts ($\Delta x11$, $\Delta y11$) and ($\Delta x12$, $\Delta y12$) from reference points as shown in FIG. 17 by programs. In a similar manner, circular marks 206c and 206d are read by the channels CH0 and CH7 indexed in the X-axis direction by p respectively when the table 5 is backwardly driven, so that misregistration amounts ($\Delta x21$, $\Delta y21$) and ($\Delta x22$, $\Delta y22$) are operated by the computer 218.

In FIG. 16, the table driving motor 141 is coupled with a rotary encoder 142, which inputs encoder pulses in the table controller 252 for feedback operation, thereby to highly accurately drive the table 5. Further, the starting point sensor 256 is formed by, e.g., a differential transformer in sensing accuracy of 1 $\mu$m. The starting point is not detected when the table 5 is backwardly driven, and the coordinates are defined by downcounting the line counter 258. FIG. 16 also shows a focus control portion operated in initial setting, and the lower edge 90 as shown in FIGS. 8 and 8A is driven by a motor 143, which is controlled by a focus controller 251 receiving pulses from the pulse generator 250 and driven by a driver 255.

Description is now made on inspection of an inspected area 204.

Figure 18:
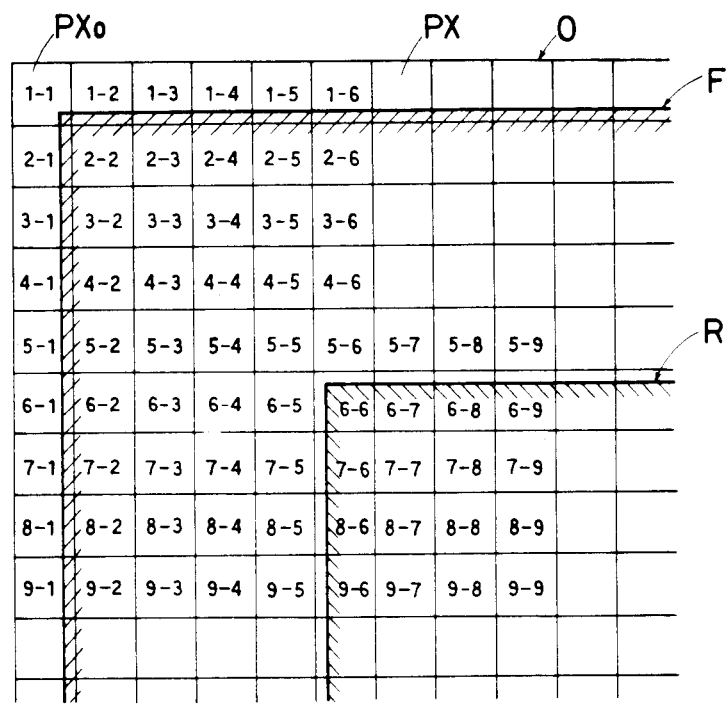
FIG. 18 is a diagram illustrative of a position of image data with respect to absolute coordinates regarding scanning.

In FIG. 18, symbol 0 indicates a pixel plane of absolute coordinates and symbol PX indicates one pixel. Symbol F indicates the position of image data of a previously image-acquired inspected area and symbol R indicates the position of subsequently acquired image data respectively with respect to the pixel plane O. The position $PX_0$ is regarded as the starting point of the pixel plane, and is the position for starting scanning in the X-axis and Y-axis directions in the inspected area, i.e., the starting poit of the time base. In the state as shown in FIG. 18, the pixel size is 16 $\mu$m and hence the positions of F and R are deviated by about 70 $\mu$m from each other. Therefore, it is of no use to compare an F pixel 7-8 and an R pixel 7-8. In order to give effect to comparison, for example, an F pixel 4-4 and an R pixel 8-8 must be compared with each other.

In the system according to the present invention, two PWBs successively positioned on a table are displaced from each other by $\pm 0.240$ mm at the maximum, i.e., $\pm 15$ pixels in units of pixels. Such space deviation must be compensated to compare data in pixel correspondence at real time.

FIGS. 19A to 19E show concepts for the comparison. Since image data concerning the former PWB is made correspondent to real time image data concerning the subsequent PWB, the subsequent image data, i.e., conceptual image data indicated by R is considered as reference.

Figure 19A:
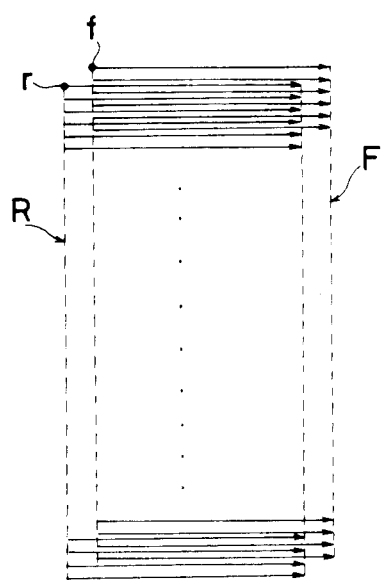
FIGS. 19A to 19E are illustrative of a method of aligning image data.

FIG. 19A shows former image data F simply moved in parallel with the subsequent image data R. In this case, the image data R and F are entirely aligned with each other by matching starting point pixel data r of the image data R to starting point pixel data f of the image data F.

Figure 19B:
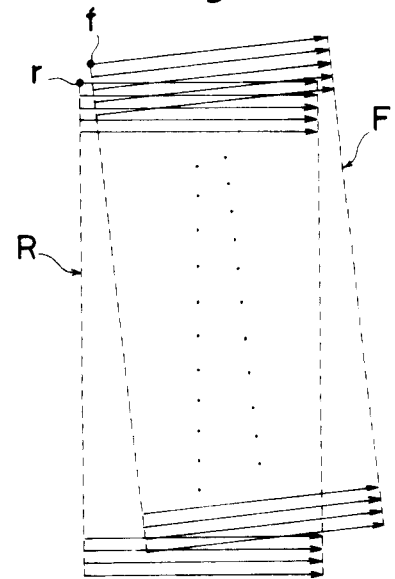

FIG. 19B shows image data F rotatingly moved with respect to image data R. In this case, the both image data F and R are not entirely alined with each other even if starting point pixel data of the respective image data are matched, i.e., a point f is moved in a parallel manner to a point r. In order to effect alignment, therefore, processes as shown in FIGS. 19C to 19E are employed.

Figure 19C:
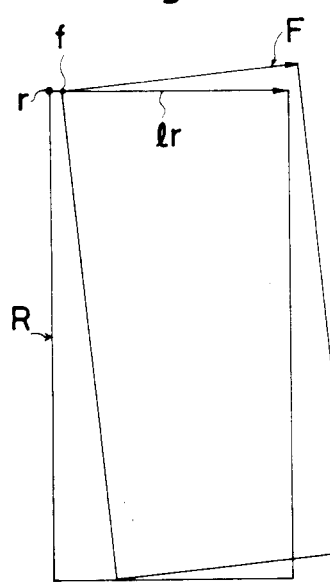

First, as shown in FIG. 19C, the point f is moved on a first scanning line $l_r$ of the image data R. This means shifting in the Y-axis direction on the coordinate plane and shifting along the line on the time base.

Figure 19D:
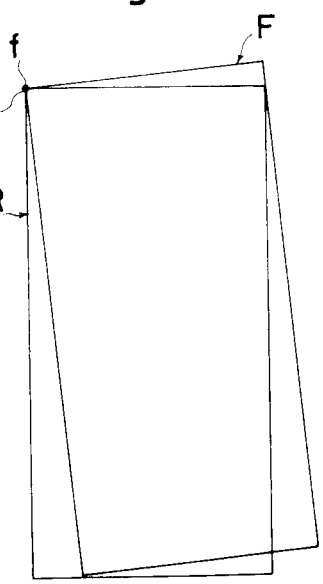

Then, as shown in FIG. 19D, the point f is matched to a starting point pixel r of the image data R on the first scanning line $l_r$. This means shifting in the X-axis direction on the coordinate plane and shifting in the pixel direction on the time base.

Figure 19E:
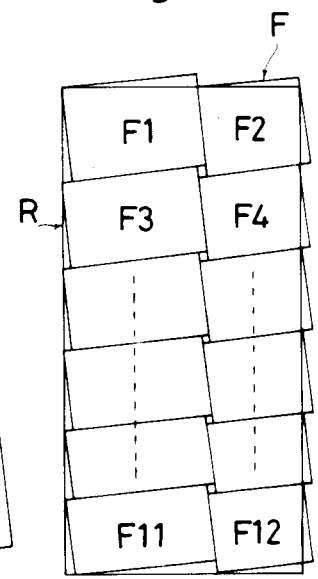

Finally, as shown in FIG. 19E, the image data F are divided into blocks F1, F2, . . . , F12 of prescribed size, so as to make comparison on the image data per block with respect to corresponding blocks of the image data R. Namely, the rotational movement is replaced by parallel movement by the division into blocks. The state as shown in FIG. 19E indicates the result of the comparison, and the number of the divided blocks is shown merely as an example.

The principle of the division into blocks is now described with reference to FIGS. 20A and 20B. Symbol $r$ indicates line data concerning the subsequent PWB, which are divided in units of pixels and typically shown by solid lines. Symbols $l_{f1}$ and $l_{f2}$ indicate continuous line data concerning the former PWB, which are also shown in units of pixels by broken lines. Starting point pixels of the lines $l_r$ and $l_{f1}$ are assumed to be matched with each other. In this state, univocally determined are points Xex in which pixels on the line $l_{f1}$ are vertically deviated from those on the line $l_r$ by over ½ pixel. Also in the Y-axis direction, points in which such deviation over ½ pixel are univocally determined. However, in the Y-axis direction, pixel changing points must be successively shifted in the X-axis direction, to successively find the changing points. Blocks and the size thereof are determined by the pixel changing points in the X and Y axes. As obvious from FIG. 20B, the line $l_r$ is compared with a portion in the left-hand side of the point Xex of the first line $l_{f1}$ and then compared with the portion in the right-hand side of the point Xex including the pixels at the point Xex of the second line $l_{f2}$. This corresponds to vertical shifting of the blocks.

In order to divide the image data into blocks, the pixel changing points are found by operation. First, the computer 218 finds, from the misregistration amount data of circular marks of two PWBs, misregistration of the former PWB with respect to the subsequent PWB, i.e., relative misregistration in the inspected areas, in more correct wording. Further found is inclination of the former inspected area with respect to the subsequent inspected area from the said relative misregistration amount. On the basis of these data, two-dimensional planes of the inspected areas are supposed to find the pixel changing points by an analytical geometric method. In the system according to the present invention, the size of the inspected area is 500 mm × 500 mm. Further, the maximum misregistration amount is $\pm 15$ pixels in units of pixels, as hereinabove described. Since sixteen inspected areas are present in physical channel number, either only one pixel changing point or no such point is present in the X-axis direction in one physical channel. With respect to the Y-axis direction, 32 pixel changing points may be caused at the maximum, assuming that the maximum misregistration is made. Therefore, the entire inspected areas are inspected in $32 \times 32$ division when the misregistration is made at the maximum both in the X and Y axis directions.

As shown in FIG. 21, the amount of offset of the former image data F with respect to the subsequent image data is found upon determination of pixel changing points $X_1, Y_1, Y_2, \ldots, Y_5$. For example, at a point $Y_3$ in the Y-axis direction, the offset amount is $M_3$ in pixel number in the X-axis direction. At a pixel changing point $X_1$ in the X-axis direction, the offset amount is K in pixel number in the Y-axis direction. It is to be noted that FIG. 21 shows one channel. Therefore, considering that the aforementioned maximum misregistration amount is $\pm 15$ pixels, K is equal to 1. Further, since the entire image data F has already been shifted in the X-axis direction, a partically applied offset amount $M_x$ in the X-axis direction is obtained by adding the amount $\Delta M$ of shifting to $M_1, M_2, \ldots$ This is also applied to the coordinate $X_1$.

Description is now made on a method of matching data in pixel correspondence on the basis of the offset data and misregistration amount data $M_y$ in the Y-axis direction.

Figure 22:
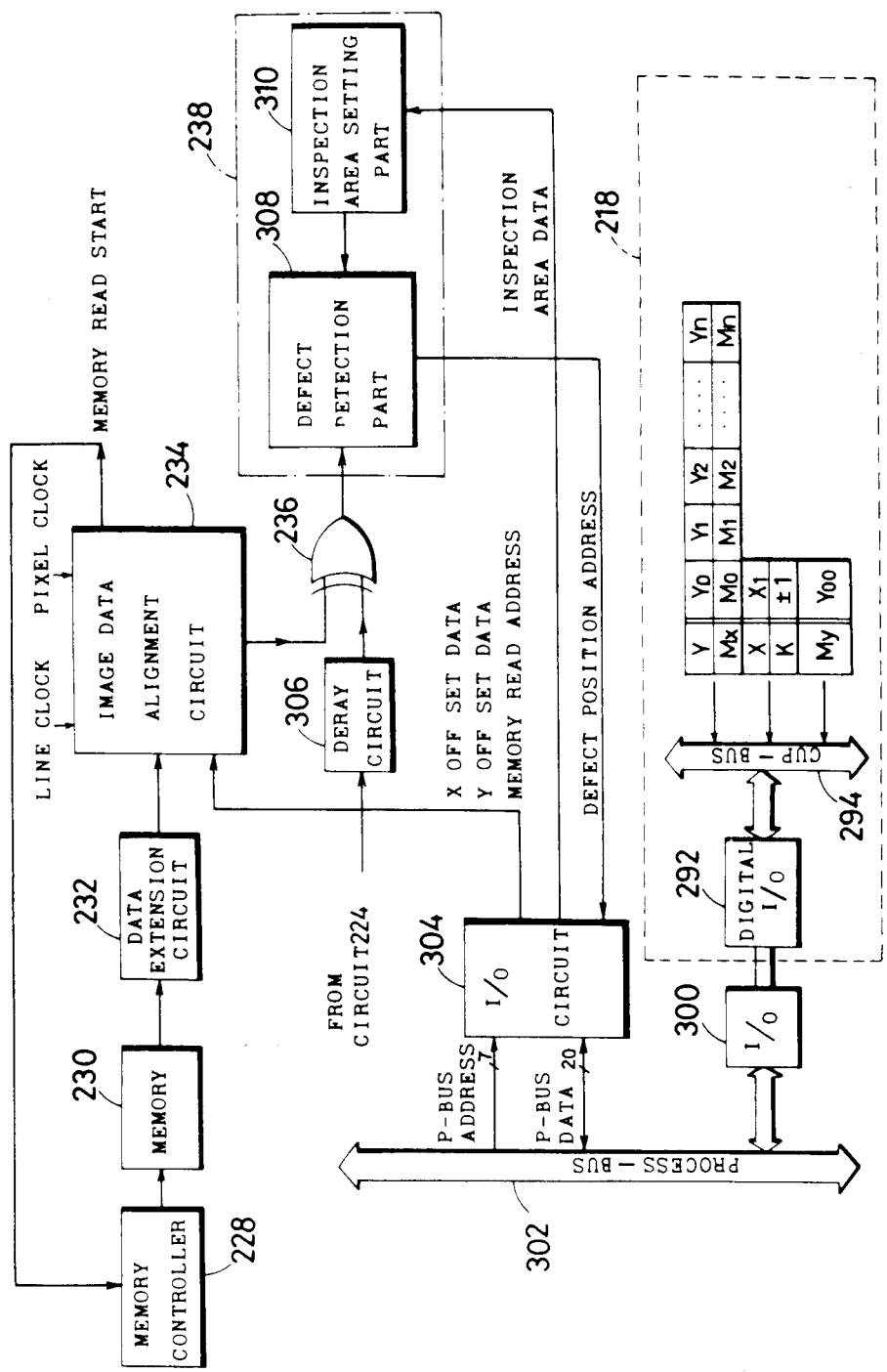
FIG. 22 is a block diagram showing a part of the electric system as shown in FIG. 12 in further detail.

In FIG. 22, X offset data $(Y, M_x)$, Y offset data $(X, K)$ and Y-axis misregistration amount data $(M_y)$ as obtained by a computer 218 are outputted to a CPU bus 294, to be outputted toward a process bus 302 through a digital I/O unit 292 and an I/O interface 300 in the system side. The process bus (P-BUS) 302 is coupled with circuits for eight channels, and an I/O circuit 304 fetches the aforementioned data corresponding to one channel by address specification from the P-BUS 302. The data fetched in the I/O circuit 304 are set at prescribed timing in an image data aligning circuit 234, which receives pixel clocks with line clocks. The Y-axis misregistration data $M_y$ correspond to a memory read address, and upon entering of the said memory read address, the circuit 234 outputs memory read starting signals to a memory controller 228, whereby the speed of reading the image data from the memory 230 is controlled. The read data are restored to the original data by a data expanding circuit 232, to be inputted in the circuit 234, which in turn re-aligns the image data in units of line data by the X and Y offset data, thereby to input the re-alined data in an exclusive OR circuit 236. The circuit 236 receives in its other input binary signals currently obtained by scanning from a binarization circuit 224 through a delay circuit 306. The results of comparison in this circuit 236 are inputted in a defect detecting circuit 308, which previously receives data on inspection rages from a circuit 310 for specifying inspected areas, to output address data on error positions within the inspection range. The address data on the error positions are inputted in the computer 218 through the I/O circuit 304, the P-BUS 302 and the I/O unit 300. The inspected area setting circuit 310 also outputs data on the range in which data comparison is ineffective.

Figure 23A:
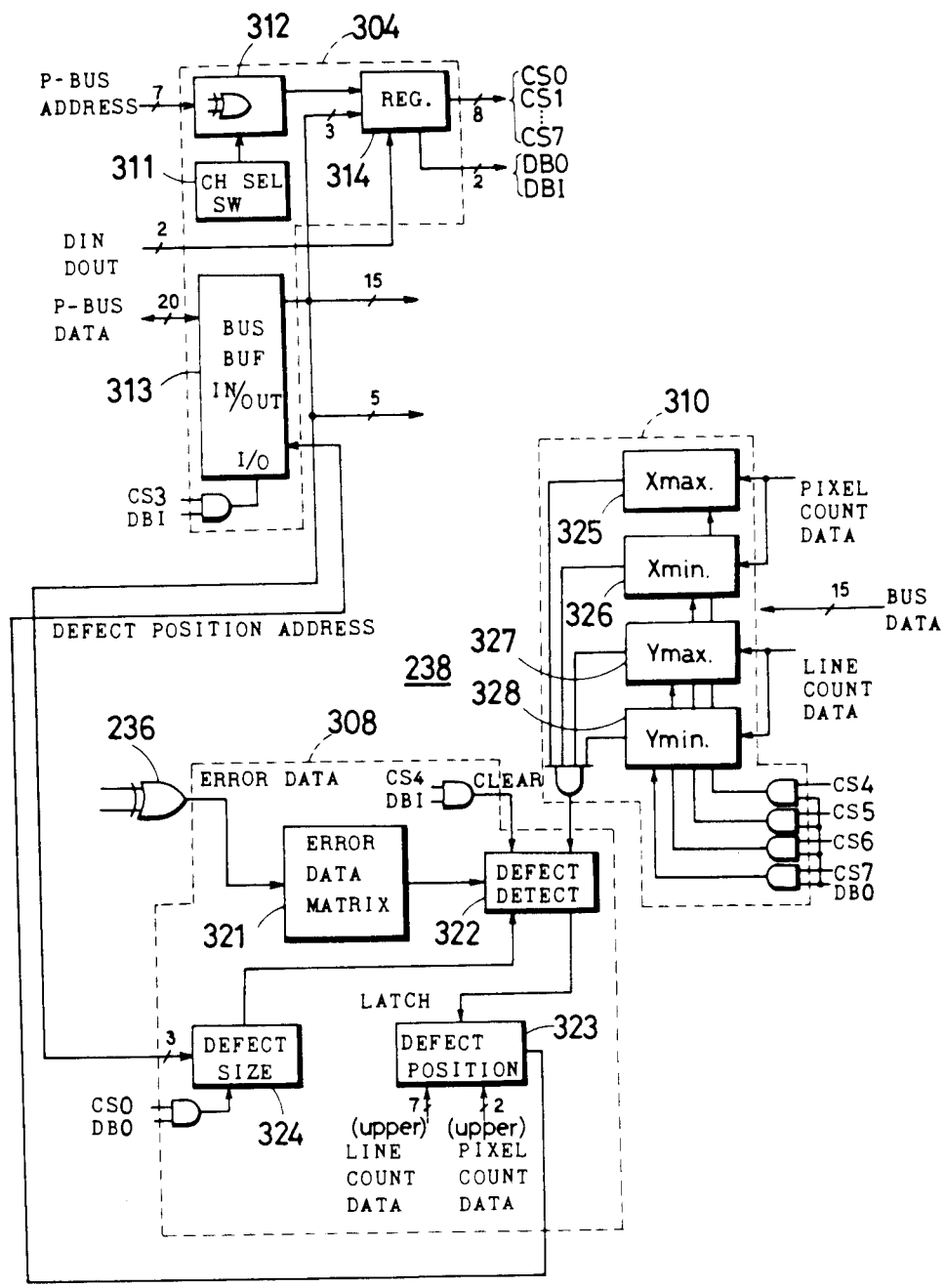
FIGS. 23A and 23B are block diagrams showing parts of the system as shown in FIG. 22 in further detail.
Figure 23B:
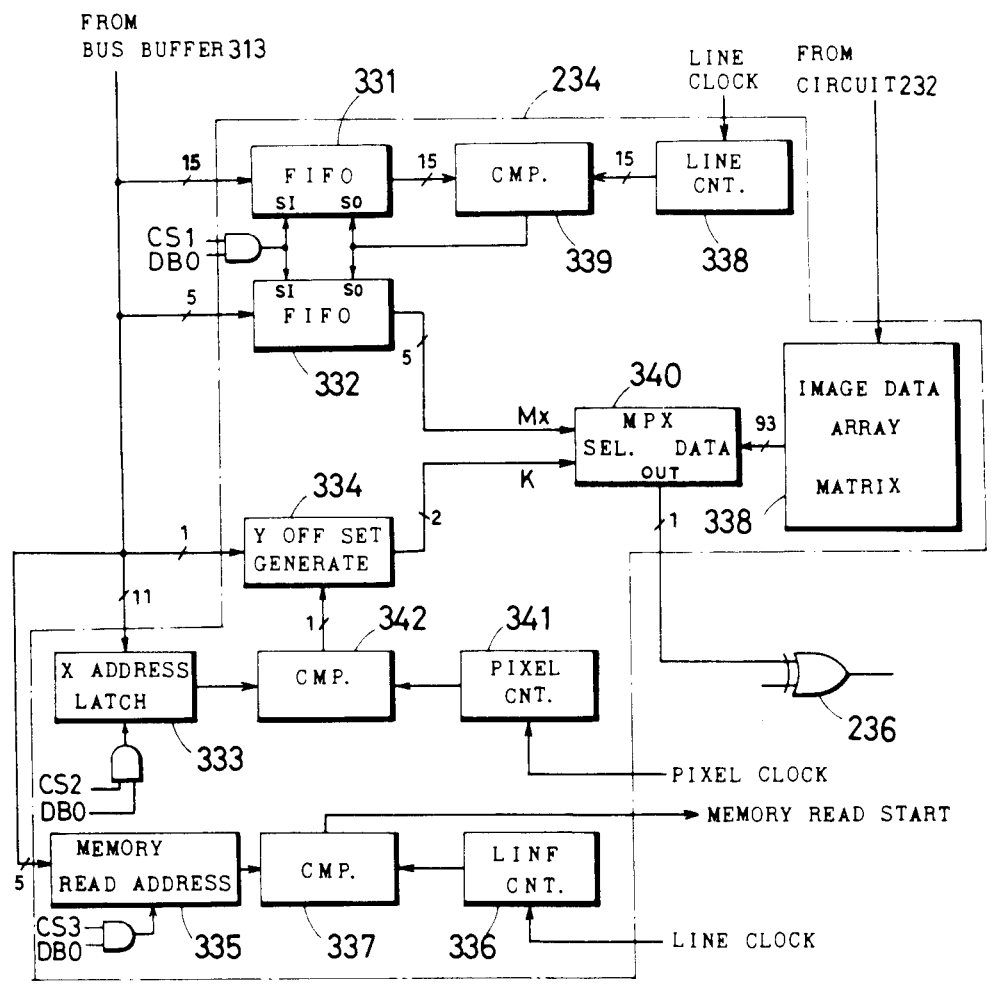

FIGS. 23A and 23B show the circuit of FIG. 22 in further detail.

In FIG. 23A, the I/O circuit 304 comprises a channel selecting switch 311 formed by, e.g., a dip switch for setting channel numbers, an address matching circuit 312 for detecting matching of address data in channels, a bidirectional bus buffer 313 for temporarily storing input/output data of the P-BUS and a control and status register/multiplexer 314 for storing, in order to supply control signals and state signals to respective circuit elements, data forming the basis thereof. The register/multiplexer 314 outputs signals DBO and DBI respectively in response to an input command DIN or an output command DOUT, thereby to store data from a buffer 313 etc. with control status signals CS0 to CS7 in register means and latch means.

The defect detecting circuit 308 comprises an error data matrix circuit 321 for receiving error data from the exclusive OR circuit 236, a defect detecting circuit 322 for making a decision on defects on the basis of outputs from the circuit 321, a defective position detecting circuit 323 for specifying defective positions by outputs from the circuit 322 and a register 324 in which data are set for specifying defect size, i.e., the range of defects horizontally and vertically found along the pixels. The said defect size can be selected from eight types, and hence the circuits 321 and 322 are adapted to cope with the maximum defect size. The circuit 323 receives, e.g., high-order 7 bits of line count data and high-order 2 bits of pixel count data, thereby to specify defective position addresses. A method of detecting defects from the error data is hereinafter described with reference to FIG. 26.

The inspection range setting circuit portion 310 comprises registers 325, 326, 327 and 328 respectively including comparators, and data on upper and lower limits concerning X and Y directions in an inspected area of one channel are set in the registers 325 to 328, to be compared with count data in the X and Y directions respectively.

Referring to FIG. 23B, X offset data $(Y, M_x)$ are successively set in FIFO registers 331 and 332 of an image data alignment control circuit 234. X addresses in the Y offset data are set in a latch circuit 333. Data K of the Y offset data are set in a register 334 for generating Y offset data. The Y-axis misregistration data $M_y$ for controlling memory reading timing are set in a register 335 for memory read addressing.

Outputs from a line counter 336 for counting line clocks are compared by a comparator 337 with outputs from the register 335, thereby to output memory ready starting signals upon matching. Image data from the data expanding circuit 232 are inputted in an image data array matrix circuit 338.

Outputs from a line counter 338 for counting the line clocks are compared by a comparator 339 with Y data outputted from the FIFO 331. Upon matching of the data, an FIFO 332 outputs X offset data $M_x$ corresponding to the Y data while the FIFO 331 outputs subsequent Y data.

The X offset data $M_x$ outputted from the FIFO are supplied to a selective input of a multiplexer 340 coupled with 93 lines of a matrix circuit 338.

Outputs from a pixel counter 341 for counting pixel clocks are compared by a comparator 342 with X addresses outputted from an X address latch circuit 333. Upon matching of the data as the result, an Y offset generator circuit 334 is activated to supply the Y offset data K to the selective input of the multiplexer 340. The multiplexer 340 selects one from 93 pixel data by data of 7 bits in total of $M_x$ and K inputted in the selective input, thereby to output the same to the exclusive OR circuit 236. The outputted pixel data is the data on a pixel corresponding in space to the pixel of pixel data currently scanned and inputted in the other input of the circuit 236.

Figure 24:
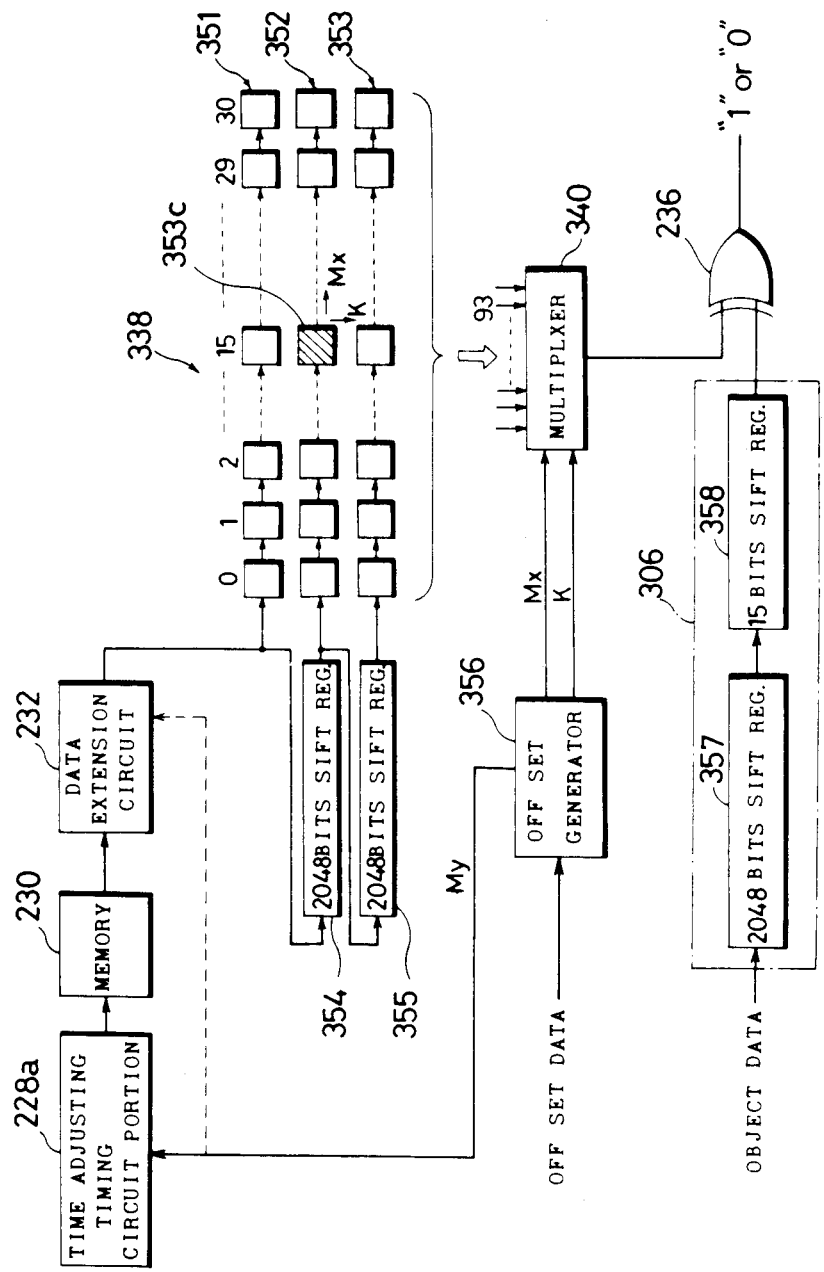
FIG. 24 is a block circuit diagram for illustrating array control of image data.

More definite description is made with reference to FIG. 24. An image data array matrix circuit 338 comprises three 31-bit shift registers 351, 352 and 353 and two 2048-bit shift registers 354 and 355. Image data from a memory 230 are inputted in a shift register 351 as well as in a shift register 354, outputs of which are supplied to shift registers 352 and 355. Outputs of the shift register 355 are inputted in a shift register 353. Contents of the respective shift registers are shifted by one bit at pixel clocks, e.g., clocks of 600 ns. Respective bit data of the shift registers 351 to 353 are inputted in a multiplexer 340 in a parallel manner.

An offset generator 356 en bloc indicates respective generators as shown in FIG. 23B. A delay circuit 306 for delaying object data obtained by scanning is formed by a 2048-bit shift register 357 and a 150-bit shift register 358. Needless to say, these shift registers are shifted in synchronization with the pixel clocks. Shifting by 2063 bits in total is provided by the shift registers 357 and 358 since a center bit 353c, shown by the slant lines, of the said 31-bit shift register 352 is regarded as the reference for the offset.

When the offset generator 356 outputs the data $M_y$, a time adjusting timing circuit portion 228a included in a memory control circuit 228 controls reading timing for the memory 230 by replacing the misregistration amounts concerning two image data in the Y-axis direction by time thereby to fastly or slowly read stored image data. Therefore, timing is predetermined with respect to the misregistration amounts. When the data expanding circuit 232 has a buffer memory for temporarily storing expanded data, reading timing of the buffer memory may be changed in units of lines by the data $M_y$, in place of the aforementioned method.

When the offset generator 356 outputs the data $M_x$ and K, one of respective bits of the shift registers 351, 352 and 353 is selected in response to the data. If no offset is caused, the reference bit 353c is selected. In the case where the former image data F are leftwardly misregistered from the subsequent data R, such a bit is selected that is deviated by a prescribed amount rightwardly from the reference bit 353c. In a reverse case, e.g., as shown in FIG. 19C, a bit in the left-hand side of the reference bit 353 is selected. If the former data F are clockwisely rotated with respect to the subsequent image data R, a bit below the reference bit 353c is selected by the data K concerning inclination. When to the contrary, e.g., in such case as shown in FIG. 19C, a bit above the reference bit 353c is selected.

Figure 25B:
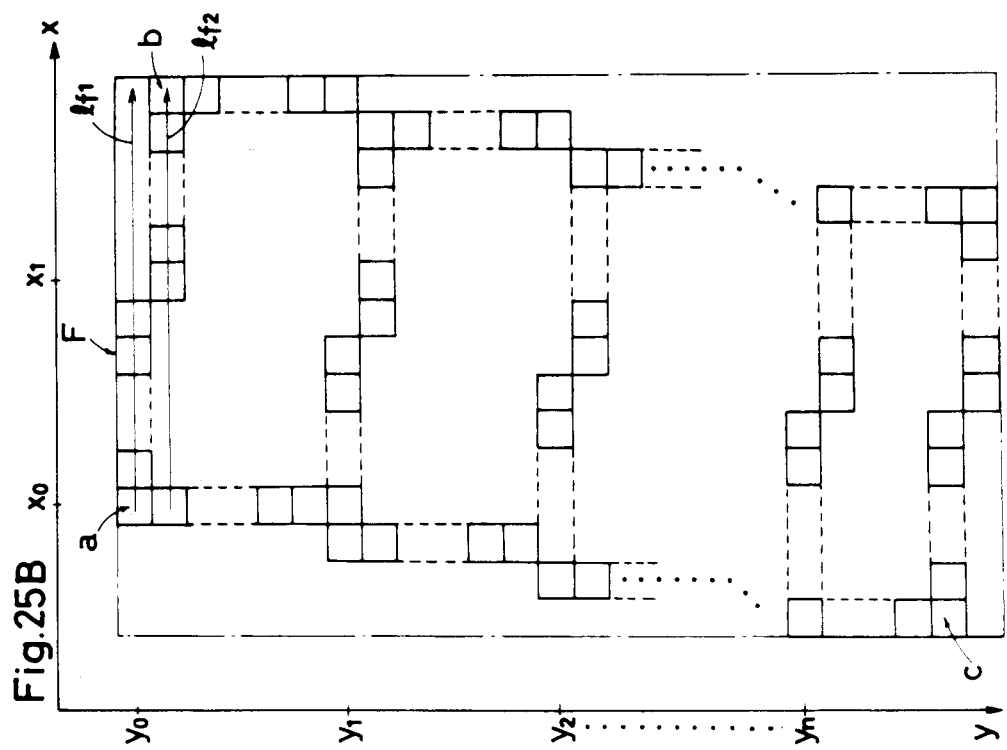
FIGS. 25A and 25B are diagrams illustrative of the manner of alignment of both image data.
Figure 25A:
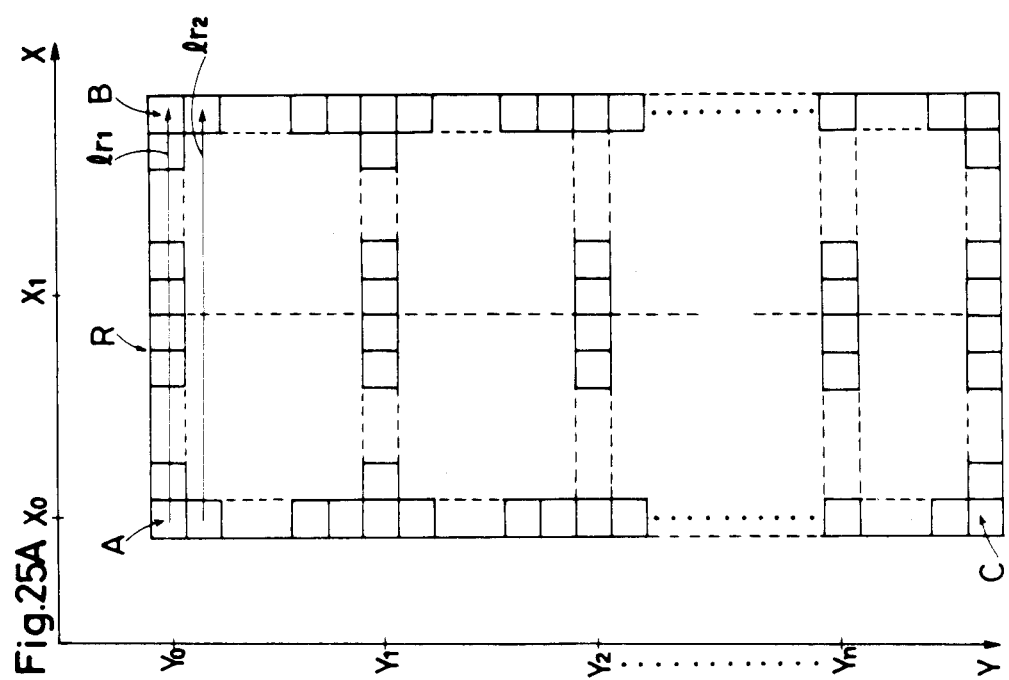

For example, FIGS. 25A and 25B show manners of pixel correspondence in space coordinate systems. Symbol R indicates subsequent image data as reference, and symbol F indicates former image data. A beginning point pixel A in a first scanning line $l_{r1}$ of the data R is compared with an offset beginning point pixel a in a first line $l_{f1}$ of the data F. A terminated point pixel B in the first scanning line $l_{r1}$ of the data R is compared with a terminated point pixel b in a second line $l_{f2}$ of the data F offset in the X-axis direction. Namely, F is offset as $X = X_1$ in the Y axis direction. A starting point pixel C in a finally scanned line of the data F is compared with a starting point pixel c in a finally scanned line of the data R.

Description is now made on a method of detecting defects, i.e., definite examples of the circuits 321 and 322 as shown in FIG. 23A.

As shown in FIG. 26A, an error data matrix circuit 321 is formed by cascade-connected required stages of 2048-bit shift registers 361, 362, 363, . . . , and the shift register 361 receives data on "1" and "0" from the exclusive OR circuit 236. When, for example, detection size is selected to be 3×3, a defect detecting mask 364, e.g., that as shown in FIG. 26B is operated with respect to the data matrix.

In definite structure, the defect detecting circuit 322 is formed by a ROM 322 as shown in FIG. 26C, so that 0, 1 and 2-order bit data of the shift registers 361 to 363 are supplied to the address input of the ROM 322. As shown in FIG. 26D, data corresponding to mask patterns are previously written in the ROM 322.

A decision on defects is made when the ROM 322 outputs "1". Reference of such a decision is the time when errors are caused over four adjacent pixels, as seen from a mask 364 in FIG. 26B, i.e., when continuous areas over 32 $\mu m \times \mu m$ are different, in terms of length. Therefore, the state as shown in FIG. 27a is decided as defective, whereas those in FIGS. 27b to 27d are not regarded as defective.

Such linear or L-shaped errors not being adjacent and defining regions are not decided as defective, in consideration of quantization errors at the edges of the wiring patterns of PWBs. Although the mask size in the foregoing description is 3×3, size of n×n may be generally effected by increasing the stage numbers of the shift registers as shown in FIG. 26A, and various types of variation may be applied to mask patterns decided as defective.

In the preferred embodiment of the present invention as hereinabove described, the image data in the memory 230 are successively replaced, most preferably in consideration of etching applied to the PWBs. However, the present invention is not restricted to such structure, and the data may be replaced every one or two PWBs. In this case, such modes are initially set by manipulating the keyboard or the like of the computer. Further, although the data in the memory 230 are replaced in principle, image data of a firstly scanned PWB may be held as an exception. Such structure is effectively applicable to production of a small number of PWBs.

The comparing system employed in the present invention requires only one reading unit in contrast to a conventional comparing system in which two pattern reading units are provided in parallel. Further, the PWBs to be inspected may be set relatively roughly in accuracy on the inspection table simply by providing positioning reference marks on the PWBs to be inspected. This means further simple structure in comparison with the conventional system requiring two parallel units, leading to increase in steps of securing accuracy in production and reduction in manufacturing cost.

Although storage units for image information are generally large-sized in the present system, the storage capacity can be relatively saved by the technical idea introduced into the storage system according to the present invention.

Further, slight changes from original photomask patterns such as thickening and thinning caused by etching processing may be well coped with by directly comparing the PWBs as the result. Further, reference pattern data are newly rewritten per inspection cycle, thereby to cope, to the same extent, with slight changes in etched states such as thinning and thickening caused by season changes of etching solutions and the like, to enable efficient finding of defects which are hard to find in general.

Further, the automatic carriage means is provided to enable automatic and continuous inspection processing in inspection steps which generally require considerable work, while products of good quality and defective ones are automatically selectively separated to remarkably improve working efficiency.

Further, although the PWBs to be inspected are generally distorted or bent, the present invention employs a method of pressing the inspected PWBs against the inspection table by the carriage plate partially forming the carriage means while absorbing the PWBs toward the inspection table, whereby the PWBs are set on the inspection table in excellent flatness. Thus, images can be correctly read to enable correct inspection.

Further, the PWB holding unit and the inspection table are provided with positioning pins while the suction pipe frames for the PWBs are provided with positioning holes with tapered engaging portions formed in the supporting portion therefor, positioning can be effected on the basis of the positioning pins, whereby the PWB carriage mechanism itself is not required to be strictly accuate. In other words, the PWBs can be highly accurately set by a relatively simple mechanism.

Further, since the exclusive PWB discharging mechanism is provided the throughput (working efficiency) can be improved in comparison with the case where feeding and discharging are performed by one carriage mechanism.

Further, since the entire inspection table is evenly moved vertically, the surfaces of the PWBs can be continuously set in the position of the focus plane even if the thickness of the PWBs is changed, whereby the inspection system can be provided at low cost in comparison with the case where an expensive automatic focusing mechanism is employed in the image pickup system.

It may be obvious for those skilled in the art that the technique disclosed in this specification may be applied to inspection of pattern defects of thick film ICs, photomasks, reticles, thermal heads and liquid crystals in addition to printed wiring boards.

What is claimed is:

1. A method of inspecting pattern defects of printed wiring boards of the same type by comparing pattern data of said printed wiring boards, said method comprising the steps of:
   placing a first printed wiring board having positioning marks being in prescribed positional relation to positioning marks of a wiring pattern on a table driven in a sub scanning direction;
   reading said marks of said first printed wiring board to find the amount of deviation of said first printed wiring board with respect to a reference position in an inspection system and thereafter performing image acquisition of an inspected area of said first printed wiring board by sequential scanning thereby to store obtained pattern data in a memory unit;
   placing a second printed wiring board having the same positioning marks as said marks on said table;
   reading said marks of said second printed wiring board thereby to find the amount of deviation of said second printed wiring board with respect to said reference position in said inspection system in order to find an amount of relative misregistration between said second printed wiring board with respect to said first printed wiring board by comparing the read marks of said first and second printed wiring boards; and
   controlling reading of pattern data of said first printed wiring board stored in said memory unit on the basis of said amount of said relative misregistration when said inspected area of said second printed wiring board is subjected to image acquisition while controlling arrangement of said read pattern data thereby to compare both pattern data in pixel data correspondence on the basis of pattern data of said second printed wiring board obtained by sequential scanning.

2. A method of inspecting pattern defects of printed wiring boards in accordance with claim 1, further including a step of simultaneously writing said pattern data of said second printed wiring board in a reading-completed memory region during reading of said pattern data of said first printed wiring board from said memory unit.

3. A method of inspecting pattern defects of printed wiring boards in accordance with claim 1, further including a step in which said pattern data of said first printed wiring board stored in said memory unit is applied to a plurality of said second printed wiring boards and said pattern data is replaced in said memory unit by pattern data of the last one of said plurality of second printed wiring boards.

4. A method of inspecting pattern defects of printed wiring boards in accordance with any of claims 1 to 3, further including a step of data-compressing said pattern data of said inspected area of said printed wiring board while restoring said compressed data to original said pattern data in comparison of said pattern data.

5. A device for detecting misregistration of printed wiring boards supplied to an inspection system for said printed wiring boards with respect to reference points ($X_0$, $Y_0$) of two-dimensional perpendicular coordinates ($X$—$Y$) previously defined in said inspection system, said device comprising:
   image input means for sequentially scanning prescribed areas provided with circular marks formed in prescribed positions with respect to wiring patterns of said printed wiring boards and including said reference points ($X_0$, $Y_0$) thereby to convert patterns of said prescribed areas into time series signals;
   binarization means for binarizing said time series signals from said image input means along the contents of said prescribed areas;
   counter means for counting numbers of pixel signals concerning said marks outputted from said binarization means with respect to an X-axis direction and a Y-axis direction respectively; and
   updown switching control means for switching and controlling respective ones of said counter means from upcount to downcount or from downcount to upcount at points of time corresponding to said reference point ($X_0$) in said X-axis direction and said reference point ($Y_0$) in said Y-axis direction, amounts of deviation from said reference points ($X_0$, $Y_0$) being found on the basis of integrated counter data obtained in respective ones of said counter means.

6. A device for detecting misregistration of printed wiring boards in accordance with claim 5, wherein said image input means also serves as image pickup means for performing image acquisition of said inspected areas including said wiring patterns of said printed wiring boards.

7. A device for inspecting pattern defects of printed wiring boards comprising:

a table for receiving said printed wiring boards having positioning marks being in prescribed positional relation to wiring patterns;

image pickup means for performing image acquisition of inspected areas of said printed wiring boards positioned on said table;

binarization means for converting output signals from said image pickup means into binary data;

storage means for storing pattern data on the basis of said binary data;

deviation detecting means for reading said positioning marks thereby detecting amounts of deviation from reference coordinates in which said marks are to be positioned;

misregistration operating means for operating and finding the amount of relative misregistration between a printed wiring board formerly placed on said table and another printed wiring board subsequently placed on said table on the basis of data on said amount of deviation found by said deviation detecting means; and misregistration correction control means for controlling reading from said storage means storing pattern data of said former printed wiring board on the basis of said data on said amounts of said relative misregistration obtained by said misregistration operating means to be in alignment, when said inspected area of said subsequently placed printed wiring board is subjected to image acquisition by said image pickup means and said binarization means outputs binary data, with said subsequent pattern data concerning said binary data while controlling arrangement of said read pattern data, thereby to compare both pattern data in pixel correspondence by said misregistration correction control means.

8. A device for inspecting pattern defects of printed wiring boards comprising:

a table for receiving said printed wiring boards having positioning marks being in prescribed positional relation to wiring patterns;

image pickup means for performing image acquisition of inspected areas of said printed wiring boards positioned on said table;

binarization means for converting output signals from said image pickup means into binary data;

storage means for storing pattern data on the basis of said binary data;

deviation detecting means for reading said positioning marks thereby detecting amounts of deviation from reference coordinates in which said marks are to be positioned;

misregistration operating means for operating and finding the amount of relative misregistration between a printed wiring board formerly placed on said table and another printed wiring board subsequently placed on said table on the basis of data on said amount of deviation found by said deviation detecting means;

misregistration correction control means for controlling reading from said storage means storing pattern data of said former printed wiring board on the basis of said data on said amounts of said relative misregistration obtained by said misregistration operating means to be in alignment, when said inspected area of said subsequently placed printed wiring board is subjected to image acquisition by said image pickup means and binarization means outputs binary data, with said subsequent pattern data concerning said binary data while controlling arrangement of said read pattern data, thereby to control both pattern data in pixel correspondence by said misregistration correction control means; and means for data-compressing said binary data outputted from said binarization means and means for restoring said compressed data read from said storage means to said original binary data.

9. A device for inspecting patterns of printed wiring boards in accordance with claims 7 or 8 which further comprises:

supplying carriage means for automatically carrying said printed wiring boards one by one onto said table; and discharging carriage means for automatically discharging said printed wiring boards after inspection from said table thereby to carry the same to a prescribed portion; wherein a respective one of said supplying carriage means and said discharging carriage means is reciprocatingly moved along a sub scanning direction in which said table is driven.

10. A device for inspecting patterns of printed wiring boards in accordance with claims 7 or 8 which further comprises:

supplying carriage means for automatically carrying said printed wiring boards one by one onto said table; and discharging carriage means for automatically discharging said printed wiring boards after inspection from said table thereby to carry the same to a prescribed portion; wherein said table is provided with means for pressing ends of said received printed wiring boards toward the surface direction of said table.

11. A device for inspecting patterns of printed wiring boards in accordance with claims 7 or 8 which further comprises:

supplying carriage means for automatically carrying said printed wiring boards one by one onto said table; and discharging carriage means for automatically discharging said printed wiring boards after inspection form said table thereby to carry the same to a prescribed portion; wherein said supplying carriage means is provided with a pressing mechanism for evenly pressing said printed wiring boards against the surface of said table when said printed wiring boards are placed on said table by said supplying carriage means.

12. A device for inspecting patterns of printed wiring boards in accordance with claims 7 or 8 which further comprises:

supplying carriage means for automatically carrying said printed wiring boards one by one onto said table; and discharging carriage means for automatically discharging said printed wiring boards after inspection form said table thereby to carry the same to a prescribed portion; wherein said supplying carriage means is in a standby state holding a subsequentially inspected printed wiring board over an initial driving position of said table and said discharging carriage means is also in a standby state over said initial driving position of said table when said table is in a driven mode; and wherein a respective one of said supplying carriage means and said discharging carriage means is reciprocatingly moved along a sub scanning direction in which said table is driven.

13. A device for inspecting patterns of printed wiring boards in accordance with claims 7 or 8, which further comprises:

supplying carriage means for automatically carrying said printed wiring boards one by one onto said table; and discharging carriage means for automatically discharging said printed wiring boards after inspection from said table thereby to carry the same to a prescribed portion.

14. A device for inspecting patterns of printed wiring boards in accordance with claim 13, wherein said supplying carriage means is in a standby state holding a subsequently inspected printed wiring board over an initial driving position of said table and said discharging carriage means is also in a standby state over said initial driving position of said table when said table is in a driven mode.

15. A device for inspecting patterns of printed wiring boards in accordance with claims 7 or 8 which further comprises:

supplying carriage means for automatically carrying said printed wiring boards one by one onto said table; and discharging carriage means for automatically discharging said printed wiring boards after inspection from said table thereby to carry the same to a prescribed portion; and printed wiring board holding means moved up and down in a vertical line with operations of said supplying carriage means and/or said discharging carriage means.

16. A device for inspecting patterns of printed wiring boards in accordance with claim 15, wherein said printed wiring board holding means are formed by an opening upper stage portion for overlappingly holding uninspected printed wiring boards and a lower stage portion provided with a container vertically divided into at least two portions, said container receiving said discharging carriage means for classifying said inspected printed wiring boards and holding the same.

17. A device for inspecting patterns of printed wiring boards in accordance with claim 16, wherein said upper stage portion of said printed wiring board holding device is upwardly provided with a first pin for positioning said printed wiring boards and said table is upwardly provided with a second pin for positioning said printed circuit boards on said table, a direction connecting said first pin and second pin being matched with a sub scanning direction;

said supplying carriage means being provided with a finely movable positioning mechanism having holes to be engaged with said first and second pins, thereby to secure positioning repeatability of said printed wiring boards with respect to said table with high accuracy.

* * * * *